United States Patent

Shinriki et al.

[11] Patent Number: 5,973,402
[45] Date of Patent: Oct. 26, 1999

[54] METAL INTERCONNECTION AND METHOD FOR MAKING

[75] Inventors: Hiroshi Shinriki; Takeshi Kaizuka; Nobuyuki Takeyasu; Tomohiro Ohta; Eiichi Kondoh, all of Chiba; Hiroshi Yamamoto; Tomoharu Katagiri, both of Tokyo; Tadashi Nakano; Yumiko Kawano, both of Chiba, all of Japan

[73] Assignee: Kawasaki Steel Corporation, Kobe, Japan

[21] Appl. No.: 08/791,161

[22] Filed: Jan. 30, 1997

Related U.S. Application Data

[62] Division of application No. 08/569,319, Dec. 8, 1995, Pat. No. 5,627,102, which is a continuation of application No. 08/215,581, Mar. 22, 1994, abandoned.

[30] Foreign Application Priority Data

| Mar. 23, 1993 | [JP] | Japan | 5-064117 |
| Mar. 26, 1993 | [JP] | Japan | 5-068673 |
| Mar. 29, 1993 | [JP] | Japan | 5-070342 |
| Nov. 11, 1993 | [JP] | Japan | 5-282493 |

[51] Int. Cl.$^6$ ............ H01L 23/48; H01L 23/52; H01L 29/40
[52] U.S. Cl. ............ 257/768; 257/763; 257/770
[58] Field of Search ............ 257/764, 765, 257/763, 751, 768, 771, 770

[56] References Cited

U.S. PATENT DOCUMENTS 5,489,367  2/1996  Kubata et al. .
5,581,125  12/1996  Maeda ............ 257/763
5,703,403  12/1997  Sobue et al. ............ 257/751

*Primary Examiner*—Jerome Jackson
*Assistant Examiner*—S. V. Clark
*Attorney, Agent, or Firm*—Oliff & Berridge, PLC

[57] ABSTRACT

A metal interconnection is prepared by forming an underlying metal film of high melting point metal such as Ti and/or high melting point metal compound such as TiN layers above a semiconductor substrate, plasma etching the surface of the underlying metal film in a gas atmosphere containing chloride, and forming an interconnecting metal film such as Al, Cu, Au and Ag on the underlying metal film. Alternatively, a metal interconnection is prepared by forming an insulating film above a semiconductor substrate, forming connection holes in the insulating film, forming an underlying metal film such as TiN on the insulating film and the bottom and side wall of the connection holes by a CVD process under controlled conditions, and forming an interconnecting metal film such as Al on the underlying metal film. The TiN film has (111) preferential orientation and the aluminum film has (111) preferential orientation, smooth surface and effective coverage. The thus fabricated metal interconnection has improved reliability including electromigration immunity when used in semiconductor devices and finding advantageous use in miniaturized semiconductor devices.

20 Claims, 17 Drawing Sheets

BCl$_3$

VAPOR PRESSURE CURVE OF DMAH

VAPOR PRESSURE CURVE OF CpCuTEP

METAL INTERCONNECTION AND METHOD FOR MAKING

This is a Division of application Ser. No. 08/569,319 filed Dec. 8, 1995 now U.S. Pat. No. 5,627,100, which in turn is a continuation of application Ser. No. 08/215,581 filed Mar. 22, 1994 and now abandoned.

BACKGROUND OF THE INVENTION

This invention relates to a metal interconnection for use in a semiconductor device having a single or multilevel interconnection structure and a method for forming the same. More particularly, it relates to a highly reliable metal interconnection advantageously applicable to finer semiconductor devices.

One commonly used method for forming a metal interconnection or wiring in prior art fine semiconductor devices including multilevel interconnection structures is by providing an underlying metal film (or conductive film) based on a high melting point metal compound such as titanium nitride (TiN), depositing an interconnecting metal film of a conductor containing Al or Al alloy thereon, and processing the deposited metal film into a desired pattern.

The underlying conductive film of a high melting point metal compound is formed at contacts between interconnecting aluminum or aluminum alloy and a silicon diffusion layer as a diffusion barrier layer or barrier metal for preventing interdiffusion of aluminum and silicon. It is effective for preventing the interconnecting metal from undergoing undesirable reaction where it is connected to silicon substrate or the like such as spiking of aluminum or interconnecting material into a shallow diffusion layer and precipitation of substrate silicon in aluminum interconnection as often seen as a result of miniaturization and higher integration. It is also effective for preventing stress-induced migration from occurring when tensile stress is applied to the metal interconnection from an insulating film formed on the metal interconnection.

In forming the high melting point metal compound film such as TiN, reactive sputtering, sputtering of a Ti film followed by nitridation, or chemical vapor deposition (CVD) is used. In depositing the interconnecting metal film such as an Al or Al alloy film, sputtering or CVD is used. It is known that the TiN films formed by reactive sputtering and sputtering of a Ti film followed by nitridation have strong (111) preferential orientation.

M. Kageyama et al., 29th Annual Proceedings, Reliability Physics Symposium, p. 97, 1991 reports that both the TiN film (underlying metal film) and the Al (interconnecting metal film) have (111) planes of the same atom arrangement and a very close atomic distance. Then on the TiN film of (111) preferential orientation is deposited an Al or Al alloy film which is also of (111) preferential orientation. As the Al or Al alloy film is enhanced in (111) orientation, the resulting interconnection is improved in electromigration immunity.

With respect to the deposition of a metal film of a conductive material containing Al or Al alloy as the interconnecting metal film, for example, K. Sugai et al., Proceeding of the 10th International IEEE Multilevel Interconnection Conference, p. 463, 1993, discloses that an Al film is deposited on the TiN film by a CVD process using dimethylaluminumhydride (DMAH).

However, it has never been reported that an Al or Al alloy film of enhanced (111) preferential orientation is formed by a CVD process using DMAH or similar reactant.

In miniaturized semiconductor devices, when metal interconnection is formed in fine connection holes, typically contact holes and via holes in an insulating film, the holes are not effectively filled up with the underlying metal film and/or interconnecting metal film, leaving the problems that voids are formed in the holes and the metal interconnection is broken at the hole side wall. With respect to this problem of poor fill-up ability, it was proposed to carry out aluminum deposition by CVD at a lower temperature of 130° C. (see K. Sugai et al., Proceeding of the 10th International IEEE Multilevel Interconnection Conference, p. 463, 1993), but at the sacrifice of deposition rate and productivity.

SUMMARY OF THE INVENTION

An object of the present invention is to solve the problems described above and to provide a metal interconnection structure having improved reliability including electromigration immunity when used in semiconductor devices and finding advantageous use in miniaturized semiconductor devices. Another object is to provide a method for forming a metal interconnection or wiring.

In order to attain the object described above, the present invention provides a method for forming a metal interconnection comprising the steps of:

forming an underlying metal film containing a high melting point metal or high melting point metal compound above a semiconductor substrate, plasma etching the surface of the underlying metal film in a gas atmosphere containing chlorine, and forming an interconnecting metal film containing a major component selected from the group consisting of Al, Cu, Au and Ag on the underlying metal film.

In one preferred embodiment, said underlying metal film is formed at least one of on said semiconductor substrate, a lower layer interconnecting film formed above said semiconductor substrate, an insulating film formed above said semiconductor substrate or said lower layer interconnecting film, and in a connection hole in the insulating film.

Preferably, said interconnecting metal film is a metal film composed mainly of aluminum.

Preferably, the step of forming said underlying metal film is such that the uppermost portion of said underlying metal film is composed mainly of said high melting point metal or high melting point metal compound, also preferably said high melting point metal is at least one member selected from the group consisting of Ti, Ta, and Nb, and further preferably and said high melting point metal compound is at least one member selected from the group consisting of TiN, VN, W$_2$N, VC, W$_2$C, and Mo$_2$N. Still further preferably, said high melting point metal is Ti and said high melting point metal compound is TiN.

Preferably, said gas atmosphere contains BCl$_3$ or Cl$_2$.

Preferably, the step of forming said interconnecting metal film includes depositing a film containing a major component selected from the group consisting of Al, Cu, Au and Ag by a CVD process.

Preferably, the step of forming said interconnecting metal film includes depositing a film composed mainly of Al by a CVD process using an organic aluminum compound as a reactant, also preferably, said organic aluminum compound is dimethylaluminumhydride, and further preferably, the step of forming said interconnecting metal film is a CVD process including heating a reactant gas containing dimethylaluminumhydride in a predetermined concentration of X (mol %) at a temperature T (°C.) in the range: 100<T<210−3.3X, feeding the reactant gas toward the surface of said underlying metal film, and depositing a film composed mainly of Al.

Preferably, the step of forming said interconnecting metal film includes depositing a film composed mainly of Al by a CVD process using dimethylaluminumhydride (DMAH) as an organic aluminum compound and cyclopentadienylcopper triethylphosphine (CpCuTEP) as an organic copper compound, and also preferably, the ratio defined by partial pressure of organic copper compound and organic aluminum compound in the CVD gas atmosphere, as (CpCuTEP partial pressure)/(DMAH partial pressure+CpCuTEP partial pressure), is from 0.001 to 0.2.

Preferably, the step of forming said interconnecting metal film includes depositing a film composed mainly of Al by a sputtering process while maintaining the substrate at a temperature of at least 350° C.

Preferably, the step of forming said underlying metal film includes depositing a film composed mainly of the high melting point metal or high melting point metal compound by a CVD process, also preferably, the step of forming said underlying metal film includes depositing a film composed mainly of TiN by a low pressure CVD process, further preferably, the step of forming said interconnecting metal film includes depositing a film containing a major component selected from the group consisting of Al, Cu, Au and Ag by a CVD process, and still further preferably, the step of forming said interconnecting metal film includes depositing a film composed mainly of Al by a CVD process using an organic aluminum compound as a reactant.

Preferably, the step of forming said underlying metal film includes depositing a first film composed mainly of the high melting point metal above the substrate, and depositing a second film composed mainly of the high melting point metal compound on the first film, also preferably, said high melting point metal is selected from the group consisting of Ti, Ta, and Nb, and said high melting point metal compound is selected from the group consisting of TiN, VN, $W_2N$, VC, $W_2C$, and $Mo_2N$, and further preferably, said high melting point metal is Ti and said high melting point metal compound is TiN.

Preferably, the step of depositing the second film composed mainly of the high melting point metal compound includes depositing a film composed mainly of TiN by a CVD process, also preferably, the film composed mainly of TiN is deposited by a low pressure CVD process using titanium halide and a nitriding substance as reactants, further preferably, the titanium halide is $TiCl_4$, the nitriding substance is selected from the group consisting of $NH_3$, hydrazine, and alkylhydrazines, and the partial pressure ratio of the nitriding substance to the titanium halide in the low pressure CVD gas atmosphere is from 11:1 to 28:1, and still further preferably, the partial pressure ratio of the nitriding substance to the titanium halide in the low pressure CVD gas atmosphere is from 20:1 to 28:1.

The present invention provides a method for forming a metal interconnection which, in the method described above, further includes the step of forming an insulating film on said semiconductor substrate, wherein the underlying metal film containing a high melting point metal or high melting point metal compound is selectively formed on said insulating film in a region where the metal connection is to be formed.

In one preferred embodiment, the step of forming the interconnecting metal film includes selectively depositing the interconnecting metal film only on the underlying metal film. Preferably, the step of forming said interconnecting metal film includes depositing a film composed mainly of Al by a CVD process using an organic aluminum compound as a reactant.

The present invention provides a method for forming a metal interconnection comprising the steps of:

forming an insulating film above a semiconductor substrate, perforating connection holes in said insulating film, each connection hole having a bottom and a side wall, forming an underlying metal film containing a high melting point metal compound on the insulating film and the bottom and side wall of the connection holes, and forming an interconnecting metal film containing a major component selected from the group consisting of Al, Cu, Au and Ag on the underlying metal film, wherein at least some of said connection holes have an aspect ratio of at least 1, the step of forming an underlying metal film includes a first step of depositing a TiN film by a low pressure CVD using titanium chloride and a nitriding substance selected from the group consisting of $NH_3$, hydrazine, and alkylhydrazines, at a partial pressure ratio of the nitriding substance to the titanium chloride of at least 50:1 and a second step of depositing a TiN film by a low pressure CVD using titanium chloride and a nitriding substance at the partial pressure ratio of the nitriding substance to the titanium chloride is from 11:1 to 28:1.

The present invention provides a method for forming a metal interconnection comprising the steps of:

forming an underlying metal film containing a high melting point metal or high melting point metal compound above a semiconductor substrate, and forming a film composed mainly of Al on the underlying metal film by a CVD process, said CVD process including using a reactant gas containing dimethylaluminumhydride in a predetermined concentration of X (mol %), heating the reactant gas at a temperature T (°C.) within the range of $100 \leq T \leq 210 - 3.3X$, and feeding the reactant gas toward the surface of said underlying metal film, thereby depositing a film composed mainly of Al.

The present invention provides a method for forming a metal interconnection comprising the steps of:

forming an underlying metal film containing a high melting point metal or high melting point metal compound above a semiconductor substrate, and forming a copper-containing aluminum film on the underlying metal film by a CVD process using organic aluminum and copper compounds as main reactants, said organic copper compound being a compound having a cyclopentadienyl group and an electron donative ligand.

The present invention provides a method for forming a metal interconnection which, in the method described above, further comprises prior to the step of forming the underlying metal film, the steps of forming an insulating film on the semiconductor substrate and perforating connection holes in the insulating film, at least some of the connection holes having an aspect ratio of at least unity.

Preferably, the electron donative ligand is a tertiary alkylphosphine, also preferably, the organic aluminum compound is an alkylaluminum hydride, further preferably, the organic aluminum compound is dimethylaluminumhydride (DMAH) and the organic copper compound is cyclopentadienylcopper triethylphosphine (CpCuTEP), and still further preferably, the ratio defined by partial pressures of organic copper compound and organic aluminum compound in the CVD gas atmosphere, as (CpCuTEP partial pressure)/(DMAH partial pressure+CpCuTEP partial pressure), is from 0.001 to 0.2.

The present invention provides a metal interconnection structure comprising a semiconductor substrate, an insulating film formed above the substrate, connection holes in the insulating film, each connection hole having a bottom and a side wall, an underlying metal film on the insulating film, said underlying metal film including a first layer composed mainly of a high melting point metal which has cubic or hexagonal crystal structure formed on the surface of the insulating film and the bottom and side wall of the connection holes and a second layer composed mainly of a high melting point metal compound which has cubic crystal structure formed on the first layer, and an interconnecting metal film composed mainly of a metal selected from the group consisting of Al, Cu, Au and Ag on the underlying metal film, wherein said first layer of said underlying metal film on the insulating film has (111) preferential orientation when said high melting point metal has the cubic crystal structure or (002) preferential orientation when said high melting point metal has the hexagonal crystal structure, said second layer and said interconnecting metal film have (111) preferential orientation, at least some of said connection holes have an aspect ratio of at least 1, and the thickness of said second layer on the side wall of those connection holes having an aspect ratio of at least 1 is at least 0.5 times the thickness of said second layer on the insulating film surface, or at least some of said connection holes are filled up with the underlying metal film.

Preferably, at least some of said connection holes are filled up with the underlying metal film and the interconnecting metal film or with the underlying metal film.

Preferably, the high melting point metal of said first layer of said underlying metal film has a first atomic distance in (111) plane when the metal has the cubic crystal structure or (002) plane when the metal has the hexagonal crystal structure, the high melting point metal compound of said second layer has a second atomic distance in (111) plane, the metal of said interconnecting metal film has a third atomic distance in (111) plane, the ratio of the second atomic distance to the first atomic distance is from 0.95 to 1.05, and the ratio of the third atomic distance to the second atomic distance is from 0.95 to 1.05.

Preferably, said high melting point metal is selected from the group consisting of Ti, Ta, and Nb, said high melting point metal compound is selected from the group consisting of TiN, VN, $W_2N$, VC, $W_2C$, and $Mo_2N$, and said interconnecting metal is Al or Au, and also preferably, said high melting point metal is Ti, said high melting point metal compound is TiN, and the interconnecting metal is Al.

DESCRIPTION OF THE PREFERRED EMBODIMENTS

The metal interconnection and method for making the same of the present invention are described below in greater detail with reference to the preferred embodiments showing in the accompanying drawings.

Figure 1A:
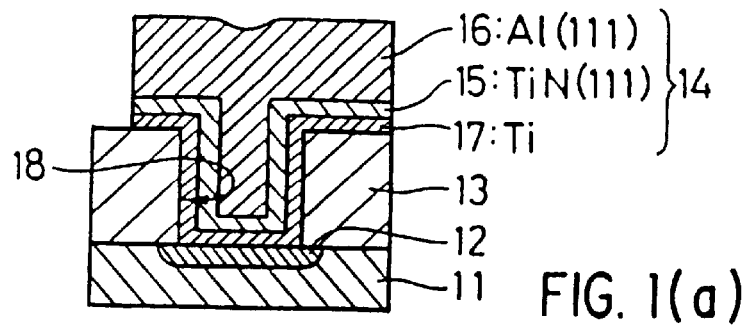
FIGS. 1(a) and 1(b) are schematic cross-sectional views of a metal interconnection structure according to embodiments of the present invention.
Figure 1B:
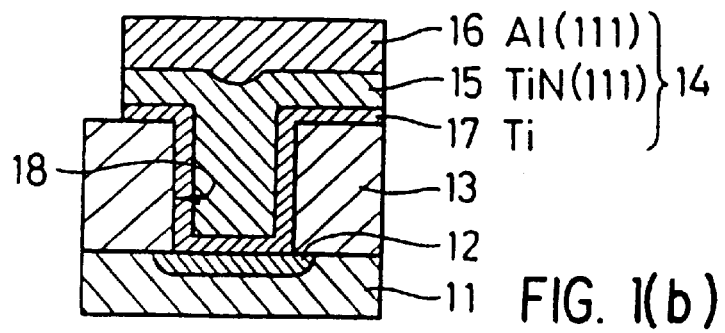

Referring to FIGS. 1(a) and 1(b), there is schematically shown in cross section one embodiment of a contact section including a metal interconnection structure according to the present invention. The illustrated embodiment includes a semiconductor substrate or lower layer in the form of a first conductivity type silicon substrate, a first layer made of titanium (Ti), a second layer made of titanium nitride (TiN), and an interconnecting metal film made of aluminum (Al), wherein the titanium nitride is of (111) orientation which is effective for controlling the crystallographic orientation of aluminum or interconnecting metal film to (111) orientation insuring long-term reliability. Although the embodiment including shape, size and manufacturing conditions is described as a typical example, the present invention is not limited thereto.

One embodiment of the metallization interconnection structure of the invention is shown in FIG. 1(a) as comprising a silicon substrate 11 of first conductivity type, a highly doped diffusion region 12 of opposite conductivity type formed in the substrate 11, an insulating film 13 thereon, a connection or contact hole 18 formed in the insulating film 13, and an upper interconnection layer 14 including an aluminum (Al) film 16, a titanium nitride (TiN) film 15, and a titanium (Ti) film 17, wherein the upper interconnection layer 14 being electrically connected to the diffusion region 12 via the contact hole 18.

On the insulating film 13 and the side wall and bottom of the connection hole 18 is formed the metal interconnection 14 in which an interconnecting metal film in the form of the Al film 16 overlies an underlying metal film including the TiN film 15 and the Ti film 17 and which is configured in a predetermined pattern. The connection hole 18 is filled up with the underlying and interconnecting metal films. On the insulating film 13, the Al, TiN, and Ti films 16, 15, and 17 have (111), (111), and (002) preferential orientation, respectively.

The Ti film 17 is effective for reacting with the highly doped diffusion region 12 to form $TiSi_2$ (not shown), reducing the contact resistance between the highly doped diffusion region 12 and the metal interconnection 14, and promoting (111) preferential orientation of the TiN film 15. The TiN film 15 is effective as a diffusion barrier layer, known as barrier metal, for preventing interdiffusion of Si atoms in the highly doped diffusion region 12 and Al atoms in the Al film 16 and also effective for promoting (111) preferential orientation of the Al film 16. It is understood that the Ti film 17 which is not a continuous one is effective for promoting (111) preferential orientation of the TiN film 15 although a continuous one is more effective and preferred. On the surface of the highly doped diffusion region 12, there may be formed a silicide such as $TiSi_2$, $CoSi_2$, $NiSi_2$, and NiSi.

In the metal interconnection structure of the present invention, the connection hole s filled up with the interconnecting and underlying metal films, there occurs no problem of breakage on the side wall of the connection hole. Since the interconnecting metal film playing a major role in electric current conduction is formed of an Al film having (111) preferential orientation, the structure has high electromigration immunity.

Figure 2A:
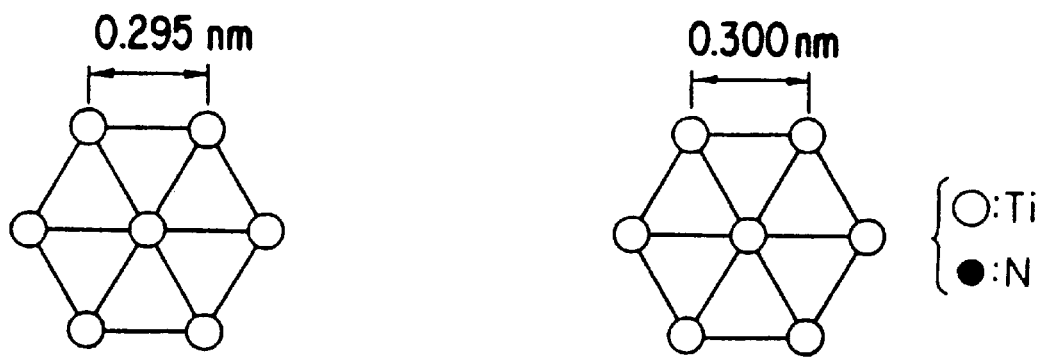
FIGS. 2(a) and 2(b) are illustrations for modeling of atomic arrangement of (002) plane of Ti and (111) plane of TiN, respectively.
Figure 2B:
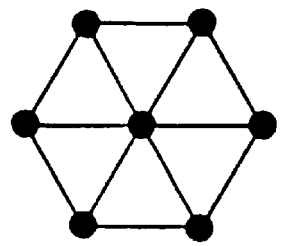

The phenomenon that the Al film has (111) preferential orientation is understood as follows. Titanium grains have the hexagonal crystal structure and tend to have (002) preferential orientation. The (002) plane of Ti has an atomic arrangement as shown in FIG. 2(a) wherein the atomic distance is equal to 0.295 nm. TiN grains have the cubic crystal structure and their (111) plane has an atomic arrangement as shown in FIG. 2(b) wherein the atomic distance is equal to 0.300 nm. Since the (002) plane of Ti and (111) plane of TiN have an identical atomic arrangement and a very close atomic distance as seen from FIG. 2, the TiN film deposited on the Ti film of (002) preferential orientation will have (111) preferential orientation. Moreover, Al grains have the cubic crystal structure like TiN grains, and have (111) plane having an identical atomic arrangement to (111) plane of TiN and an atomic distance of 0.286 nm which is very close to the atomic distance of TiN. Therefore, the Al film deposited on the TiN film of (111) preferential orientation will have (111) preferential orientation.

FIG. 1(b) illustrates another embodiment of the interconnection structure according to the present invention as comprising a silicon substrate 11 of first conductivity type, a highly doped diffusion region 12 of opposite conductivity type formed in the substrate 11, an insulating film 13 thereon, and a connection or contact hole 18 perforated in the insulating film 13.

On the insulating film 13 and the side wall and bottom of the connection hole 18 is formed an underlying metal film including a TiN film 15 and a Ti film 17 such that the connection hole 18 is filled up with the underlying metal film. On the underlying metal film on the insulating film 13 is deposited an interconnecting metal film in the form of an Al film 16. These films are configured in a predetermined pattern to form a metallization interconnection structure 14. On the insulating film 13, the Al, TiN, and Ti films 16, 15, and 17 have (111), (111), and (002) preferential orientation, respectively.

EXAMPLE 1

Figure 3A:
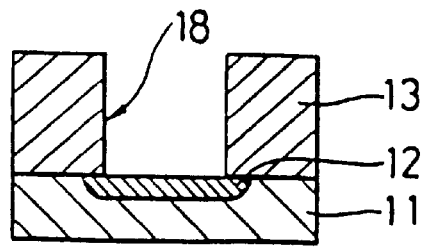
FIGS. 3(a) to 3(e) illustrate successive steps of a process of forming a metal interconnection according to one embodiment of the present invention.
Figure 3B:
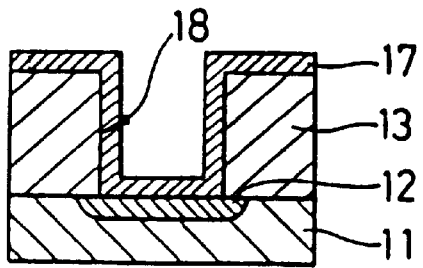

FIGS. 3(a) to 3(e) illustrate sequential steps of one exemplary process of forming a metal interconnection structure according to the present invention. Each step is schematically illustrated by the cross-sectional view of a contact portion. In a silicon substrate 11 of first conductivity type was formed a highly doped diffusion region 12 of opposite conductivity type as shown in FIG. 3(a). An interlayer insulating film 13 of silicon oxide was formed on the substrate 11 to a thickness of about 0.8 $\mu$m, for example. That portion of the insulating film 13 on the highly doped diffusion region 12 was selectively removed by dry etching, to form a connection hole 18 of 0.4 $\mu$m diameter, for example. Next, in an early stage of a first step in the metal interconnection structure forming method of the present invention, a Ti film 17 was formed on the surface of insulating film 13 and the side wall and bottom of connection hole 18 by sputtering as shown in FIG. 3(b). The Ti film 17 was formed to a thickness of 5 nm, for example, on the surface of the insulating film 13.

Figure 3C:
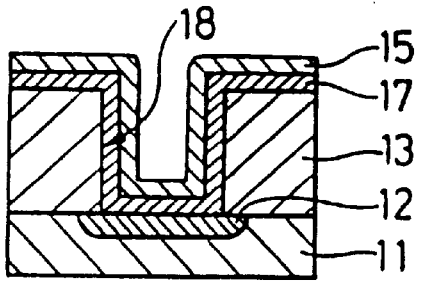

Next, FIG. 3(c) shows a later stage of the first step of forming a TiN film 15 of 50 nm thick, for example, on the Ti film 17. The TiN film 15 was formed under appropriate conditions, for example, a pressure of 0.1 Torr and a substrate temperature of 650° C. by feeding $TiCl_4$ and ammonia gases as reactants at a flow rate of 0.5 and 10SCCM, respectively, while adding 10 SCCM of hydrogen. Under such conditions, the TiN film 15 assumed (111) preferential orientation. Step coverage was satisfactory to such an extent that the film thickness on the connection hole side wall was substantially equal to that on the insulating film.

Figure 3D:
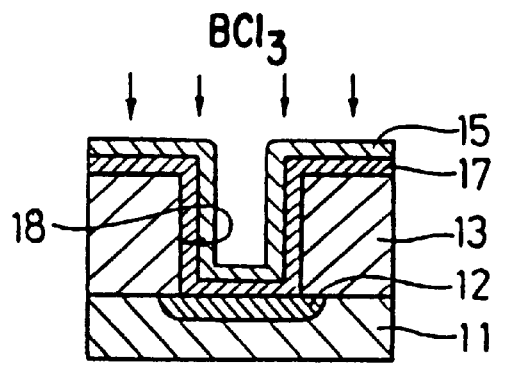

Next, in a second step, the TiN film 15 on the surface was plasma etched using $BCl_3$ gas as shown in FIG. 3(d). Exemplary plasma etching conditions included a $BCl_3$ flow rate of 80 SCCM, an Ar flow rate of 20 SCCM, a pressure of 0.1 Torr, an RF power density of 0.37 W/cm², and an etching time of 3 minutes. Under these conditions, the surface of the TiN film 15 was etched about 10 nm deep.

In a third step, an Al film 16 was formed on the TiN film 15 by a CVD process, for example, to a thickness of 0.8 $\mu$m. Exemplary CVD conditions included a total pressure of 2 Torr and a substrate temperature of 210° C. Deposition was made by using dimethylaluminumhydride (DMAH) as a reactant gas and hydrogen as a carrier gas and feeding these gases into a reactor to establish a DMAH partial pressure of 34 mTorr. The connection hole 18 was filled up with the Al film 16. Since the titanium nitride film 15 was of (111) preferential orientation, the Al film 16 similarly assumed (111) preferential orientation. The multilayer metal film consisting of Al film 16/TiN film 15/Ti film 17 was then patterned to form a metal interconnection structure 14.

This example utilized a deposition apparatus which could perform deposition of TiN film, plasma etching and CVD of Al without a need to take out the sample to the ambient air. Then the sample surface was not exposed to the ambient air from the deposition of TiN film 15 to the deposition of Al film 16.

EXAMPLE 2

Figure 4A:
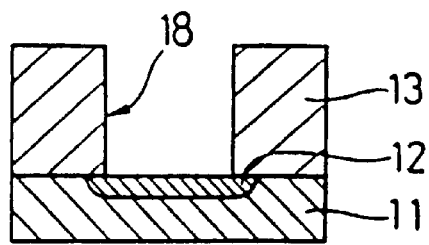
FIGS. 4(a) to 4(e) illustrate successive steps of a process of forming a metal interconnection according to another embodiment of the present invention.
Figure 4B:
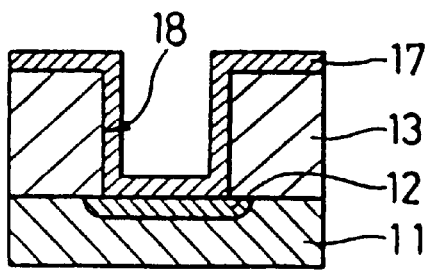

FIGS. 4(a) to 4(e) illustrate sequential steps of another exemplary process of forming a metal interconnection structure according to the present invention. Each step is schematically illustrated by the cross-sectional view of a contact portion. In a silicon substrate 11 of first conductivity type was formed a highly doped diffusion region 12 of opposite conductivity type as shown in FIG. 4(a). An interlayer insulating film 13 of silicon oxide was formed on the substrate 11 to a thickness of about 0.8 $\mu$m. That portion of the insulating film 13 on the highly doped diffusion region 12 was selectively removed by dry etching, to form a connection hole 18 having a diameter of 0.4 $\mu$m, that is, an aspect ratio (hole depth/diameter) of 2. Next, in an early stage of a first step in the metal interconnection structure forming method of the present invention, a Ti film 17 was formed on the surface of insulating film 13 and the side wall and bottom of connection hole 18 by sputtering as shown in FIG. 4(b). The Ti film 17 was formed to a thickness of 5 nm on the insulating film 13.

Figure 4C:
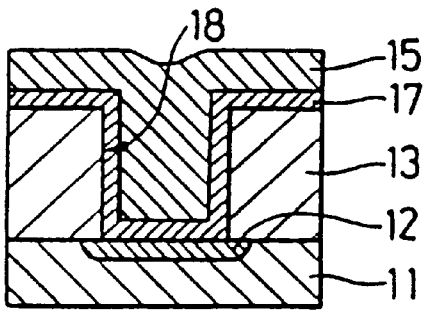
Figure 4D:
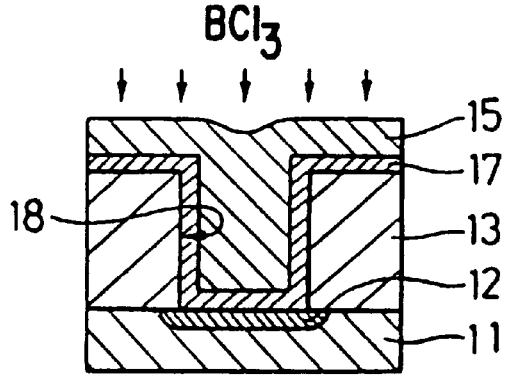
Figure 4E:
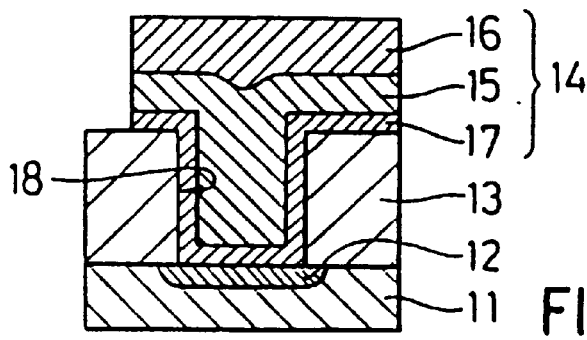

Next, FIG. 4(c) shows a later stage of the first step of forming a TiN film 15 on the Ti film 17 by a CVD process. The TiN film 15 assumed (111) preferential orientation. Step coverage was satisfactory. Deposition of 0.2 $\mu$m of titanium nitride resulted in the connection hole 18 being filled up with the underlying metal film consisting of Ti and TiN films 17 and 15. Next, in a second step, the TiN film 15 on the surface was plasma etched using BCl$_3$ gas as shown in FIG. 4(d). Thereafter, in a third step, an Al film 16 was formed on the TiN film 15 by a CVD process, for example, to a thickness of 0.8 $\mu$m. Since the titanium nitride film 15 was of (111) preferential orientation, the Al film 16 similarly assumed (111) preferential orientation. The multilayer metal film consisting of Al film 16/TiN film 15/Ti film 17 was then patterned to form a metal interconnection structure 14.

In this example, the Al film 16 is not required to have a high ability to fill up the connection hole since the connection hole is filled up with the underlying metal film consisting of Ti and TiN films 17 and 15. Then the Al film 16 may be deposited by any process other than CVD, for example, a sputtering process featuring high productivity.

It is also possible that once the TiN film 15 is deposited so as to fill up the connection hole 18, the TiN film 15 on the insulating film 13 is etched back for thickness reduction before the Al film 16 is formed. Then for an identical height, a metal interconnection structure having lower resistance can be prepared by increasing the thickness of the Al film 16 by an amount corresponding to the thickness reduction of the TiN film 15. This etching-back can be done by modifying the conditions of plasma etching prior to deposition of the Al film 16 such that the TiN film 15 may be etched in a larger amount or by using another apparatus. In the latter case, the etching-back is followed by plasma etching which is, in turn, followed by deposition of the Al film 16 without taking out to the ambient air.

Insofar as it is of (002) preferential orientation, the Ti film 17 which is formed on the insulating film 13 in the early stage of the first step of the metal interconnection structure forming method of the present invention is not limited in its form and thickness. This means that the Ti film 17 may be a continuous film or a discontinuous film including island-like and particulate films. A surface coverage of more than 50% and a film thickness of 5 to 100 nm are preferred. This is because a titanium film with a surface coverage of less than 50% or a thickness of less than 5 nm would be insufficient to reduce the contact resistance between the highly doped diffusion region 12 in the silicon substrate 11 and the metal interconnection structure 14 and would be less effective for promoting (111) preferential orientation of the overlying TiN film 15, resulting in a TiN film 15 which is short of (111) preferential orientation. The Ti film deposited by sputtering is inferior in fill-up ability. So, with a titanium film thickness of greater than 100 nm, the metal interconnection as a whole would lose fill-up ability.

The TiN film 15 which is formed on the Ti film 17 in the later stage of the first step is not limited in its thickness insofar as it is of (111) preferential orientation. Preferably the TiN film 15 is at least 30 nm thick when considered from its functions to serve as a barrier layer for preventing interdiffusion between Si and Al atoms and to promote (111) preferential orientation of the Al film 16 which is formed on the TiN film 15. The upper limit of the thickness of the TiN film 15 need not be determined since the connection hole 18 is filled up with the TiN film 15. Preferably the TiN film 15 has a thickness of not greater than 0.4 $\mu$m in order to maintain the resistance of the metal interconnection low where etching back of the TiN film is omitted in Example 2.

EXAMPLE 3

In order to demonstrate the benefits of the metal interconnect structure and the method of making according to the present invention, films 17, 15 and 16 of Ti, TiN and Al, respectively, were sequentially deposited on an insulating film 13 under various conditions to fabricate a series of structures in which each Al film 16 was examined for orientation.

The samples to be examined were fabricated by following the above-mentioned steps until the TiN film 15 was formed. Film forming conditions were the same as previously described. That is, the Ti film 17 was formed by the above-mentioned sputtering process and the TiN film 15 was formed by the above-mentioned CVD process. Note that no connection hole 18 was formed.

Sample 1: This sample was fabricated by plasma etching the thus formed TiN film 15 as previously described, and then forming an Al film 16 by the above-mentioned CVD process. The conditions of plasma etching and aluminum CVD were the same as previously described.

Sample 2: This sample was fabricated by directly forming an Al film 16 on the thus formed TiN film 15 by the above-mentioned CVD process. The conditions of aluminum CVD were the same as previously described. No surface treatment was done on the TiN film 15.

Sample 3: This sample was fabricated by directly forming an Al film 16 on the thus formed TiN film 15 by a sputtering process. The sputtering conditions are as follows.

target: Al—0.5 wt % Cu substrate temperature: 180° C.

Ar pressure: 3 mTorr input power: 3 kW

Sample 4: This sample was fabricated by effecting argon back sputtering on the thus formed TiN film 15 instead of the plasma etching, and then forming an Al film 16 by the above-mentioned CVD process. The back sputtering conditions are given below.

Ar flow rate: 2 SCCM total pressure: 0.05 Torr

RF power density: 0.37 W/cm$^2$ sputtering time: 5 min.

The aluminum CVD conditions were the same as previously described.

In Samples 1 to 4 each fabricated under a set of conditions as mentioned above, the orientation of the Al film 16 was determined by X-ray diffractometry.

In all the four samples, it was confirmed by an X-ray diffraction pattern obtained by ($\theta$–2$\theta$) scanning with Cu K$\alpha$ ray that the TiN film 15 had (111) preferential orientation. However, the (111) diffraction of the Al film 16 had a different intensity in each sample.

Figure 5:
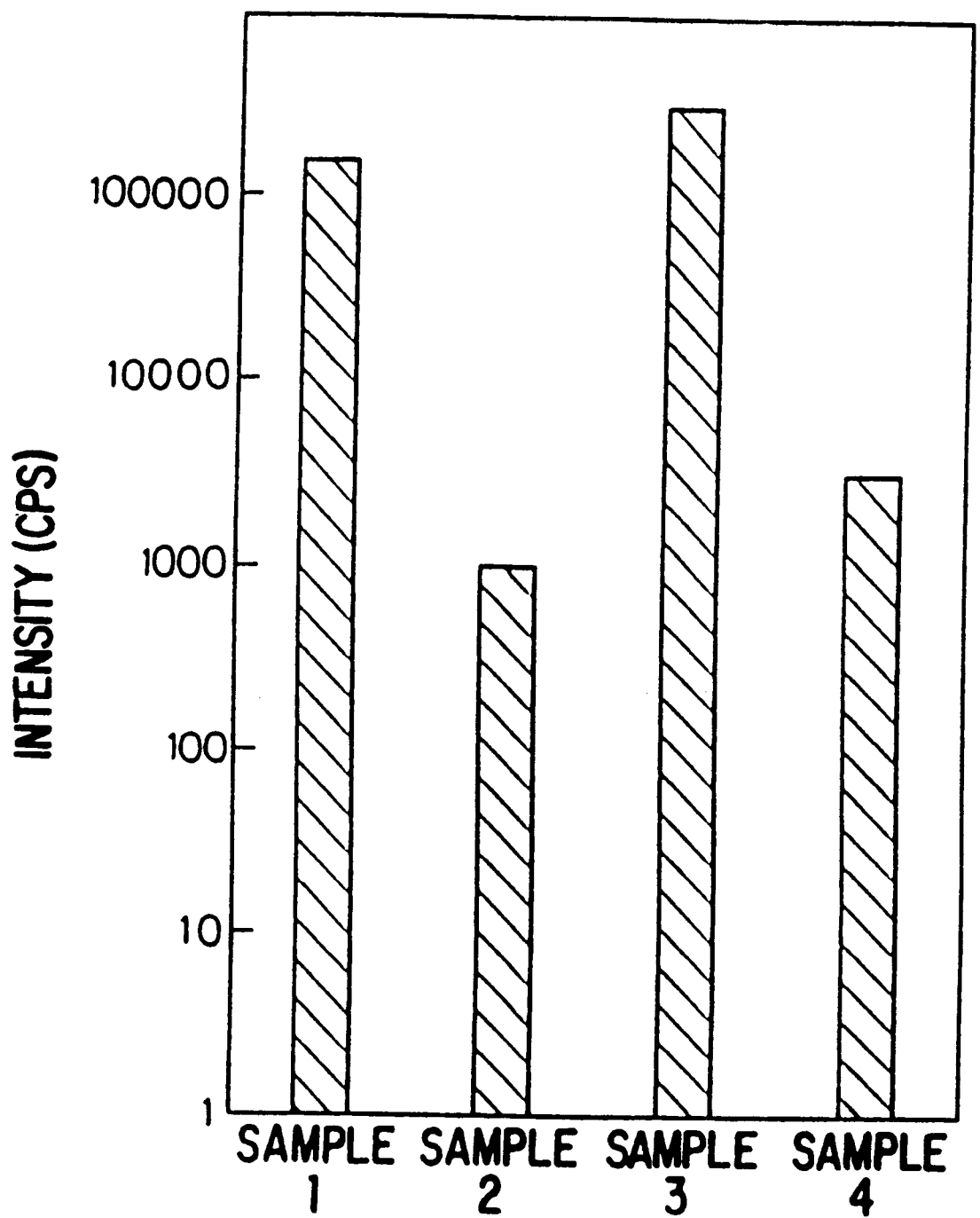
FIG. 5 is a graph plotting the XRD intensity of Al film samples including inventive and comparative ones, showing the orientation of film.

For Samples 1 to 4, the diagram of FIG. 5 shows the peak intensity of (111) orientation of the Al film 16 in its X-ray diffraction pattern. As seen from the diagram, Sample 1 which was fabricated by the metal interconnection structure forming method of the present invention and sample 3 has maximum peak intensity, with no substantial difference therebetween. Sample 4 in which Ar back sputtering was followed by deposition of the Al film 16 has a peak intensity of (111) orientation of the Al film which is somewhat greater than that of Sample 2, but considerably lower than those of Samples 1 and 3.

In Sample 1, carrying out heat treatment at 600 to 900° C. in an atmosphere containing a nitriding gas such as $N_2$ and $NH_3$ after deposition of the Ti film 17 for nitriding the surface of the Ti film 17 was effective for enhancing the (111) orientation of the Al film 16. For example, by carrying out heat treatment at 800° C. for 30 seconds in $N_2$ at atmospheric pressure, the (111) peak intensity of the Al film 16 was enhanced about 100 times. By nitriding the surface of the Ti film 17, there is formed a TiN layer of enhanced (111) orientation which helps further enhance the (111) orientation of the TiN film 15 deposited thereon. It was also effective for enhancing the (111) orientation of the Al film 16 to effect heat treatment on the TiN film 15 at a temperature higher than its deposition temperature, for example, at a temperature of 700° C. or higher.

The gas used in plasma etching may be chlorine series gases such as $Cl_2$ and $SiCl_4$ as well as $BCl_3$. Among them, $BCl_3$ and $Cl_2$ are preferred to provide the underlying metal film with a clean surface without leaving any contaminant deposit. It is also possible to add a diluent gas such as He and Ne instead of argon. It is acceptable to use a chlorine series gas alone.

EXAMPLE 4

Figure 6A:
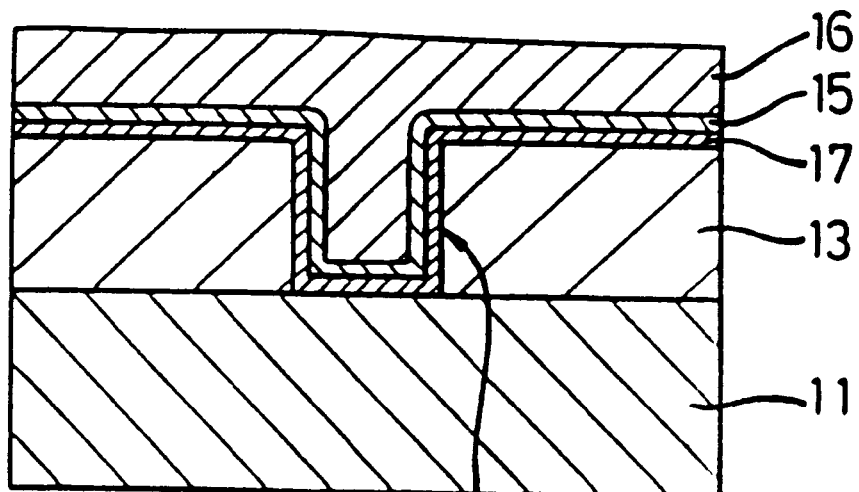
FIG. 6 illustrates how a fine connection hole in a multi-level interconnection structure is advantageously filled up with an interconnecting metal film according to the inventive method.
Figure 6B:
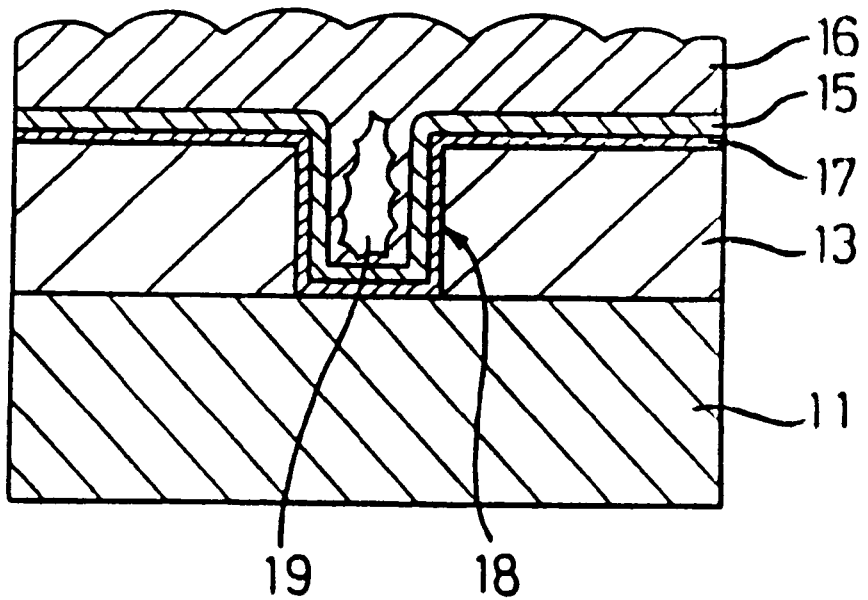

To evaluate the fill-up ability of an interconnecting metal film in the metal interconnection structure of the present invention, a similar experiment to the foregoing one was carried out by forming a connection hole 18 of the same shape as used in the foregoing example in the insulating film 13 on the silicon substrate 11. Reference is made to FIGS. 6(*a*) and 6(*b*).

On a sample surface in which a connection hole 18 had been formed, a Ti film 17 was deposited by sputtering and a TiN film 15 of 50 nm thick was deposited by a CVD process. At this point, three different samples were fabricated, including one wherein no treatment was done on the surface of the TiN film 15, one wherein Ar back sputtering was done on the surface of the TiN film 15, and one wherein plasma etching was done on the surface of the TiN film 15. On each of these samples, an Al film 16 was deposited by a CVD process.

FIG. 6(*a*) is a cross-sectional view of the sample wherein plasma etching was done on the surface of the TiN film 15, indicating that the connection hole 18 was fully filled up and the Al film 16 had a flat surface. In contrast, FIG. 6(*b*) is a cross-sectional view of the sample wherein no treatment was done on the surface of the TiN film 15, indicating that the Al film 16 had a rugged surface and non-uniform globular growth occurred within the connection hole 18 to form a void 7 therein. Faulty fill-up leads to a failure to establish a sound contact or via plug. Further evaluation was made on connection holes having a lower aspect ratio to find that a connection hole having an aspect ratio of 0.6 could not be filled up.

The sample wherein Ar back sputtering was done on the surface of the TiN film 15 was improved in flatness of the aluminum film surface as compared with the sample without surface treatment shown in FIG. 6(*b*), but less improved in filling-up of the connection hole 18 with the Al film 16.

Examples 3 and 4 utilized a deposition apparatus which could perform deposition of TiN film by CVD, plasma etching, Ar back sputtering, aluminum sputtering and aluminum CVD without a need to take out the sample to the ambient air. Then the sample surface was not exposed to the ambient air from the deposition of TiN film 15 to the deposition of Al film 16. When a sample having a TiN film already deposited thereon was taken out from the apparatus, exposed to the ambient air, and then inserted again into the apparatus where plasma etching and Al film deposition by CVD were carried out, enhanced (111) orientation and satisfactory filling were accomplished to substantially the same extent as accomplished without exposure to the ambient air. It is to be noted that exposure of the sample surface to the ambient air should be avoided between plasma etching and Al film deposition.

The above-described phenomenon is interpreted as follows. In proximity of the surface of the TiN film 15 prior to deposition of the Al film 16, there is present an altered layer having a disordered atomic arrangement or adsorbed a foreign material containing organic matter. Aluminum grains being deposited inherit the orientation of the altered layer and thus assume orientation slightly offset from (111) direction. Then the Al film 16 containing Al or Al alloy is weakened in (111) orientation. If foreign matter is adsorbed, aluminum grains preferentially grow from where the foreign matter is adsorbed and these aluminum grains are not controlled in orientation. Then the Al film 16 is weakened in (111) orientation. In contrast, if there is present no altered layer or no adsorbed matter on the surface of the TiN film 15, only aluminum grains which inherit (111) orientation of the underlying TiN film 15 deposit on the TiN film 15, resulting in an aluminum film 16 having enhanced (111) orientation.

If preferential growth of aluminum grains nucleated from the adsorbed matter occurs at an upper portion in the connection hole 18, a portion of the connection hole interior which is located below the upper portion and closer to the bottom of the connection hole is lowered in reactant gas concentration and hence, deposition rate. As a result, aluminum grains continue to deposit only above the connection hole 18, leaving a void 19 as shown in FIG. 6(*b*).

Figure 3E:
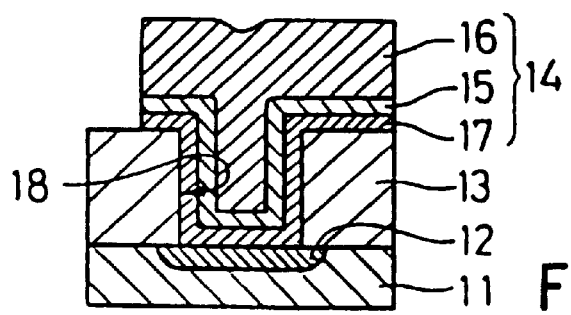

In contrast, when surface treatment is carried out on the TiN film 15 by plasma etching as required in the method of the present invention, the altered layer or adsorbed foreign matter is removed from the surface of the TiN film 15. This eliminates preferential growth of aluminum grains or growth of aluminum grains without orientation control. Deposition of aluminum film 16 proceeds uniformly over the entire surface of the TiN film 15 including that surface portion within the connection hole 18. As a result, even a fine connection hole is completely filled up without leaving a void as shown in FIG. 3(e).

A loss of fill-up associated with preferential growth of aluminum grains becomes more outstanding where the Al film 16 is deposited by sputtering. The reason is that no deposition occurs in the interior of the connection hole 18 shaded by aluminum grains. It has been found that plasma etching is also effective in this situation.

The Ar back sputtering employed as the surface treatment is somewhat effective for removing an altered layer or adsorbed foreign matter from the surface of the TiN film 15, but to a less extent as compared with the plasma etching. Particularly with respect to the surface portion of the TiN film 15 which is deposited on the inner wall of the connection hole 18, the back sputtering is not as effective as the plasma etching.

As a conclusion, it has been found that where plasma etching is employed as surface treatment in the second step of the method of the present invention for forming a metal interconnection structure, the subsequently deposited Al film 16 is significantly improved in (111) orientation and fill-up ability as compared with cases where no surface treatment is done although all the remaining steps of forming respective films (including insulating film 13, Ti film 17, TiN film 15, Al film 16, etc.) are identical.

Next, we examined how the deposition conditions of the TiN film 15 affected the coverage of the TiN film 15 and the orientation of the Al film 16. In the experiment, the flow rate of $NH_3$ was varied to vary the partial pressure ratio of $NH_3$ to $TiCl_4$ in the range of from 5 to 100. The remaining conditions are as previously described.

Figure 7A:
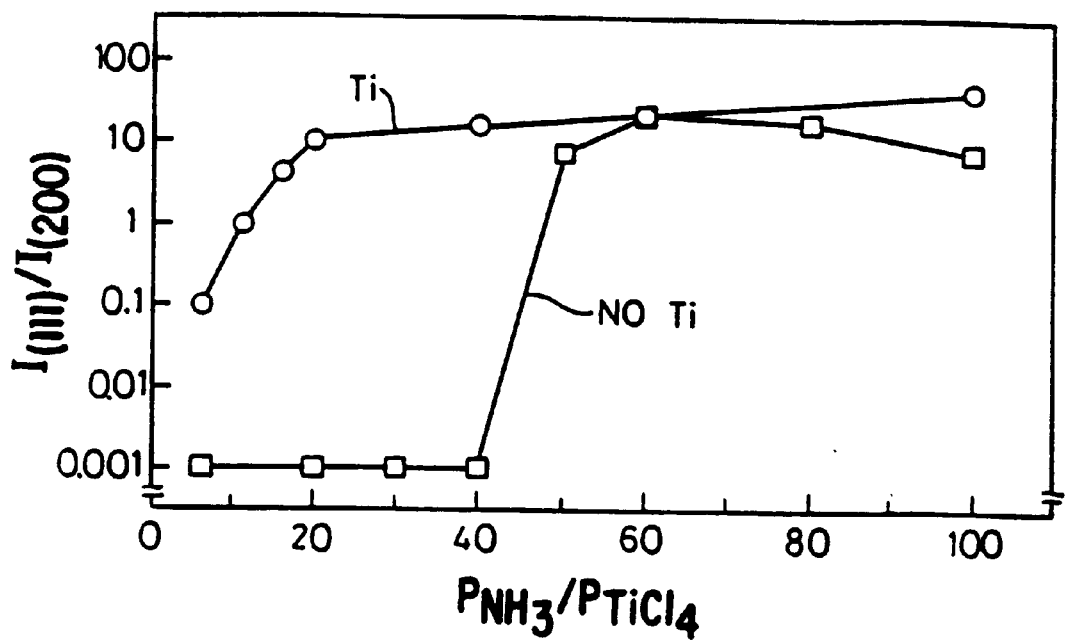
FIGS. 7(a) and 7(b) are graphs showing the intensity ratio of (111) peak to (200) peak and coverage of TiN film as a function of $NH_3/TiCl_4$ partial pressure ratio.

FIG. 7(a) plots the intensity ratio of (111) peak to (200) peak of the TiN film relative to the partial pressure ratio. It is seen that (i) in the partial pressure ratio range of 5 to 20, the peak intensity ratio I(111)/I(200) abruptly increases with an increasing partial pressure ratio, as represented by a peak intensity ratio of 1 at a partial pressure ratio of 11 and a peak intensity ratio of 10 at a partial pressure ratio of 20 and that (ii) in the partial pressure ratio range of 20 to 100, the peak intensity ratio slowly increases with an increasing partial pressure ratio, as represented by a peak intensity ratio of 40 at a partial pressure ratio of 100. The diagram of FIG. 7(a) also shows the results obtained where the TiN film 15 is deposited directly on the insulating film 13 without depositing the Ti film 17. In this case, the peak intensity ratio I(111)/I(200) was 0.001 at a partial pressure ratio of up to 40, indicating formation of a TiN film of substantial (200) orientation.

Figure 8:
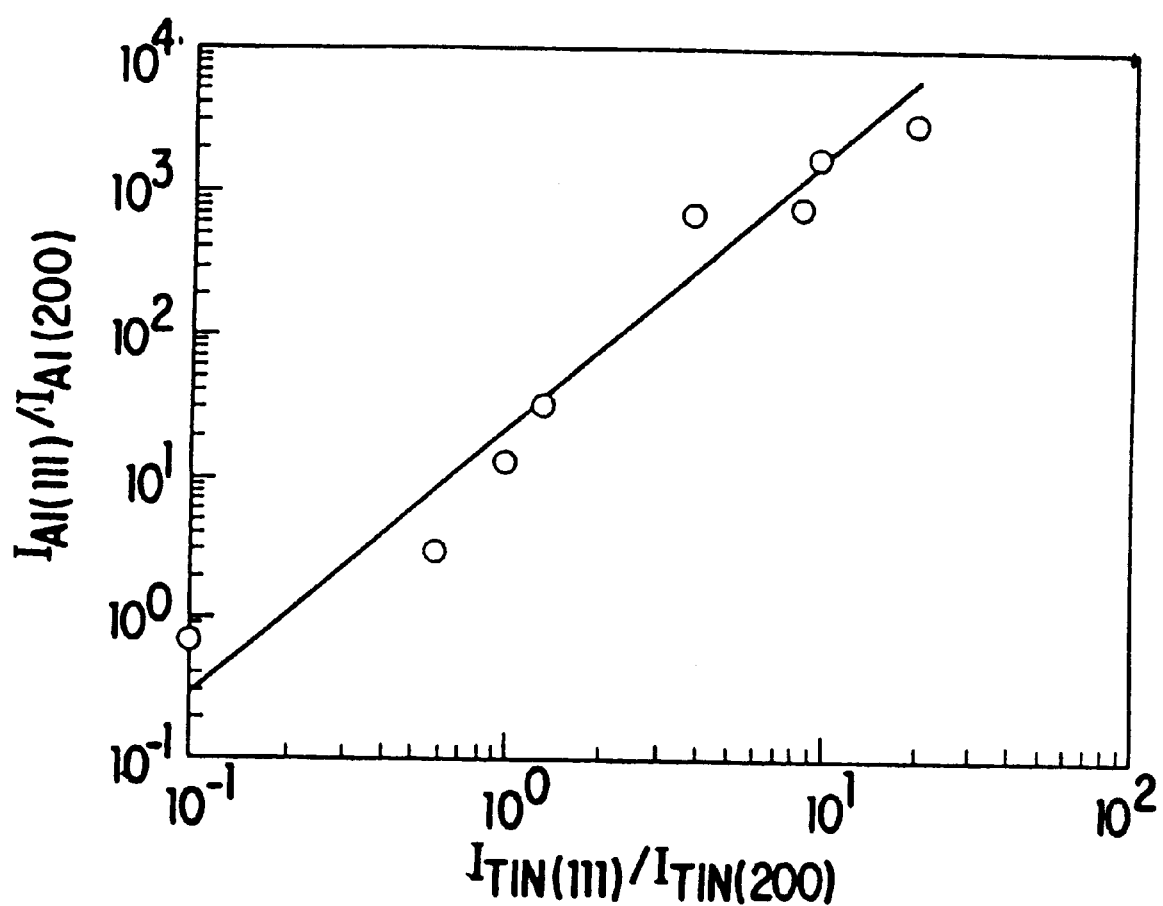
FIG. 8 is a graph showing the intensity ratio of (111) peak to (200) of Al film by CVD as a function of the intensity ratio of (111) peak to (200) peak of TiN film.

FIG. 8 plots the intensity ratio of (111) peak to (200) peak of the CVD aluminum film deposited on the TiN film after plasma etching, $I_{Al}(111)/I_{Al}(200)$, as a function of the peak intensity ratio of the TiN film, $I_{TiN}(111)/I_{TiN}(200)$. The peak intensity ratio of the Al film increases with an increasing peak intensity ratio of the TiN film as represented by an Al film peak intensity ratio of 20 and 2000 at a TiN film peak intensity ratio of 1 and 10, respectively.

Figure 7B:
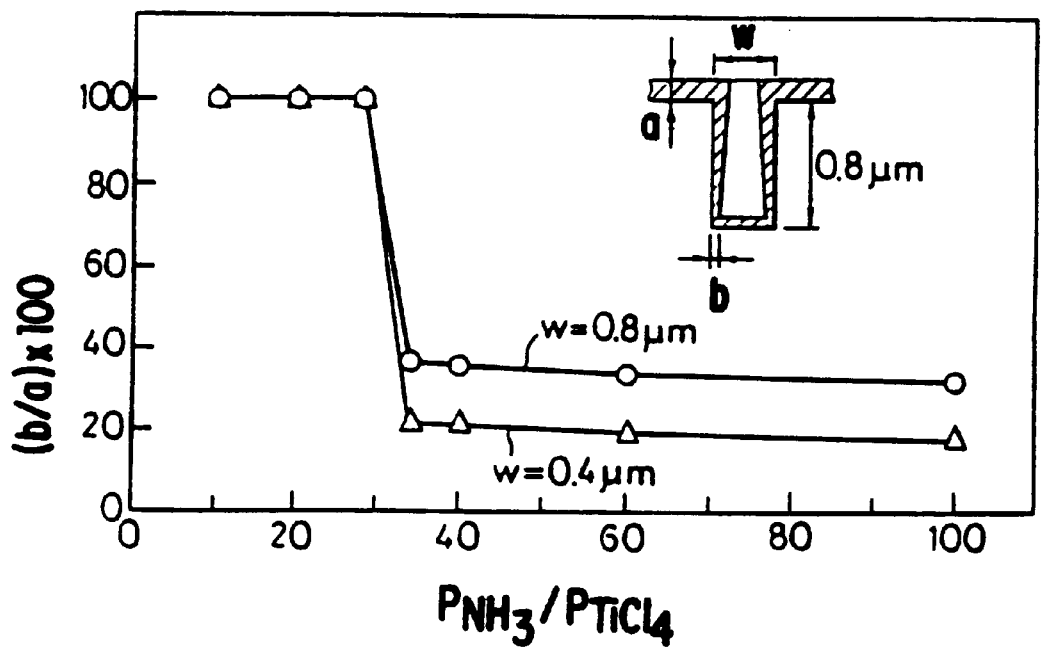

FIG. 7(b) plots the bottom coverage achieved when TiN is deposited in a connection hole of 0.4 $\mu$m diameter and 0.8 $\mu$m depth (the bottom coverage being a film thickness, b, on the side wall of the connection hole near the bottom portion divided by a film thickness, a, on the insulating film surface, that is, b/a×100%) as a function of a partial pressure ratio of $NH_3$ to $TiCl_4$. The coverage is approximately 100% at a partial pressure ratio of up to 28 and then lowers to about 22% at a partial pressure ratio of 34, and further below about 20% at a partial pressure ratio 25 of more than 60. it has been found that the coverage does not depend on whether or not the Ti film 17 is present. FIG. 7(b) also shows the bottom coverage achieved when TiN is deposited in a connection hole of 0.8 $\mu$m diameter and 0.8 $\mu$m depth. Similar dependency of bottom coverage on partial pressure ratio was recognized. The coverage is approximately 100% at a partial pressure ratio of up to 28 and then lowers to about 37% at a partial pressure ratio of 34, and further below about 35% at a partial pressure ratio of more than 60.

It is to be noted that the coverage referred to above is associated with a connection hole having a circular shape in cross section. For a connection hole having an ellipsoidal shape, provided that the ellipsoidal hole has an aspect ratio defined as depth to minor diameter, its coverage is approximately equal to that of a circular hole having an identical aspect ratio.

From these results, it has been found that in order that an aluminum film gain favorable orientation and fill-up property at the same time, the partial pressure ratio should preferably be set in the range between 11 and 28, more preferably between 20 and 28.

This favorable partial pressure ratio range is available only when the Ti film 17 is interposed between the TiN film 15 and the insulating film 13 whereas no appropriate range for meeting both orientation and fill-up property at the same time is available when no Ti film is interposed. More particularly, a partial pressure ratio of more than 50 allows a TiN film having a peak intensity ratio of more than 8 to be formed, but within this range, the coverage in a connection hole having an aspect ratio of 2 is less than 20%.

It is to be noted that even when no Ti film 17 is interposed, both orientation and fill-up property can be met at the same time insofar as a first TiN sub-film having (111) preferential orientation is thinly deposited under a first set of conditions including a partial pressure ratio of greater than 50 and a second TiN sub-film is then deposited under a second set of conditions including a partial pressure ratio between 11 and 28. Since the first TiN sub-film has a low coverage, the coverage of the entire TiN film is lowered as the first TiN sub-film becomes thick. More particularly, the first TiN sub-film on the insulating film 13 should preferably have a thickness of up to 20%, more preferably up to 10% of the size of the minimum connection hole (diameter for a circular hole and minor diameter for an ellipsoidal hole). Insofar as the first TiN sub-film has a thickness of at least 5 nm on the insulating film 13, the second TiN sub-film has (111) preferential orientation.

If reactive sputtering was used for deposition of the TiN film, the coverage was as low as 5% or less for connection holes having an aspect ratio of 2 and 10% or less for connection holes having an aspect ratio of 1.

In the above-mentioned embodiments, a contact structure wherein electrical contact is made to a semiconductor or silicon substrate 11 through a contact hole 18 perforated in an insulating film 13 lying on the substrate 11 is illustrated as a typical example of the metal interconnection structure although the present invention is not limited thereto. The metal interconnection structure of the present invention is also applicable to a contact structure wherein electrical contact is made to a lower layer interconnection composed of a polycrystalline silicon, a high melting point metal, a silicide and the like, or a via structure wherein electrical connection is made to a lower layer interconnection composed of a metal such as Al alloy through a via hole formed in an insulating layer intervening between upper and lower layers of interconnection of a semiconductor device having a multilevel interconnection structure, or a single level interconnection structure which is free of a connection hole (such as a contact hole and via hole) or which is formed on an insulating film except for a connection hole. Of course, in all cases, the metal interconnection structure is configured in a predetermined wiring pattern.

Although a combination of the Ti film 17 deposited by sputtering and the TiN film 15 deposited thereon by CVD is used as the underlying metal film in the foregoing embodiments, the present invention is not limited thereto. The Ti film can be deposited by any desired method other than sputtering, for example, typically by evaporation. The TiN film can be deposited by any desired method other than CVD, for example, by reactive sputtering or by heating a sputtered Ti film in an atmosphere containing a nitriding gas whereby the Ti film is nitrided. For application to a miniaturized semiconductor device, for example, a semiconductor device including connection holes with an aspect ratio of at least unity, the CVD process is preferably used because of its fill-up ability.

Although the TiN film was deposited by a CVD process using $TiCl_4$ as a titanium halide and $NH_3$ as a nitriding substance in the foregoing embodiments, other reactants may be used. The titanium halide may be $TiBr_4$, $TiI_4$, etc. as well as $TiCl_4$ and the nitriding substance may be hydrazine $N_2H_4$ and alkyl hydrazines such as monomethylhydrazine $(CH_3)HNNH_2$, etc. as well has $NH_3$. Since any of these nitrogen source materials releases one nitrogen atom per molecule in the CVD reaction, these nitrogen source materials may be used at a similar partial pressure ratio as used in the foregoing embodiment, achieving excellent orientation and coverage. Additionally, in forming TiN film by CVD in the practice of the inventive method, the reactant system used is not critical insofar as it contains a titanium compound. In addition to the titanium halide mentioned above, organic compounds such as tetradiethylaminotitanium may be used. The conditions under which TiN film is formed by CvD are not limited to the foregoing embodiments. Any set of conditions may be used insofar as TiN film of quality is obtained when directly deposited on a semiconductor substrate. In a $TiCl_4/NH_3/H_2$ system, for example, a choice may be made among a substrate temperature of 650 to 750° C., $NH_3/TiCl_4$ partial pressure ratio of from 11:1 to 28:1, a $H_2/NH_3$ partial pressure ratio of from 0:1 to 1:1, and a total pressure of 10 mTorr to 10 Torr.

Another underlying metal film which can be used herein is a combination of a TiN film 15 and a Ti film deposited thereon. The Ti film which is formed on the TiN film having (111) preferential orientation has (002) preferential orientation and an aluminum film to be deposited thereon will have (111) preferential orientation. A single layer of TiN may also be used as the underlying metal film. If TiN is deposited by reactive sputtering, then the resulting TiN film will have enhanced (111) preferential orientation even in the absence of the Ti film 17, allowing an aluminum film having enhanced (111) preferential orientation to be deposited thereon. When applied to a connection hole (via hole) for connection to a lower layer interconnection such as aluminum, a single layer of Ti may also be used. The Ti film which is formed by sputtering has (002) preferential orientation, which allows an aluminum film having enhanced (111) preferential orientation to be deposited thereon because (002) plane of Ti and (111) plane of Al have an identical atomic arrangement and a very close atomic distance.

The underlying metal film or each layer of the underlying metal film need not necessarily be a film of pure high melting point metal or high melting point metal compound. For example, titanium may be replaced by a Ti—W alloy and titanium nitride may be replaced by TION, TiWN, etc. In order that the interconnecting metal film have (111) preferential orientation, the underlying metal film or each layer thereof should preferably be composed predominantly of Ti or TiN with another component being present in an amount not to substantially alter the crystal structure and atomic distance of the Ti or TiN film. For example, if the TiN film deposited by reactive sputtering is exposed to the ambient air, it will absorb oxygen from the air to convert into a TiON film containing 2 to 20 wt % of oxygen. Since this oxygen pickup causes no substantial change to the crystal structure and atomic distance, the aluminum film deposited thereon will again have (111) preferential orientation.

Instead of Ti and TiN, a high melting point metal selected from Group IVa metals such as Zr and Hf, Group Va metals such as V, Nb and Ta, and Group VIa metals such as Mo and W and a high melting point metal compound selected from nitrides, oxynitrides, borides, boronitrides and carbides of these metals may be used. A film containing at least one of the high melting point metals and the high melting point metal compounds may be used as the underlying metal film in a single layer or multi-layer form. Also in this case, the surface of the underlying metal film is plasma etched so that an aluminum film may be subsequently deposited with satisfactory coverage.

That portion of the underlying metal film which contacts a highly doped diffusion region or a lower layer of aluminum alloy metallization, that is, the lowermost layer of the underlying metal film should preferably contain a highly reactive Group IVa metal or Group Va metal, especially Ti, Zr or Hf because of reduced contact resistance. On the other hand, that portion of the underlying metal film which contacts the interconnecting metal film, that is, the uppermost layer of the underlying metal film should preferably contain a high melting point metal compound as a major component for preventing reaction with the interconnecting metal film.

In order to form an interconnecting metal film having (111) preferential orientation, the uppermost layer of the underlying metal film should preferably composed mainly of a high melting point metal or high melting point metal compound which has an atomic arrangement identical with (111) plane of the interconnecting metal and an atomic distance close to the interconnecting metal, typically within a relative difference of 5%. For several high melting point metals, high melting point metal compounds and interconnecting metals, their crystal structure and atomic distance are shown in Table 1.

TABLE 1

| Material | Crystal system | Lattice constant (nm) | Atomic distance (nm) |
|---|---|---|---|
| Al | cubic | 0.405 | 0.286 |
| Au | cubic | 0.408 | 0.288 |

TABLE 1-continued

| Material | Crystal system | Lattice constant (nm) | Atomic distance (nm) |
|---|---|---|---|
| Ti | hexagonal | 0.295 | 0.295 |
| Ta | cubic | 0.403 | 0.286 |
| Nb | cubic | 0.405 | 0.286 |
| TiN | cubic | 0.425 | 0.300 |
| VN | cubic | 0.414 | 0.292 |
| $W_2N$ | cubic | 0.413 | 0.292 |
| VC | cubic | 0.412 | 0.291 |
| $W_2C$ | cubic | 0.422 | 0.299 |
| $Mo_2N$ | cubic | 0.417 | 0.295 |

As seen from Table 1, for an interconnecting metal film composed mainly of aluminum, the above-mentioned requirement is satisfied by Ta, Nb, VN, $W_2N$, VC, $W_2C$, and $Mo_2N$ as well as the Ti and TiN used in the foregoing examples, indicating that these metals and metal compounds are preferred main components of which the underlying metal film is made. Among them, Ti has the hexagonal crystal structure and has a (002) plane atomic arrangement identical to the (111) plane atomic arrangement of aluminum and an atomic distance close to that of aluminum as previously mentioned. The remaining metals other than Ti all have the cubic crystal structure and have a (111) plane atomic arrangement identical to the (111) plane atomic arrangement of aluminum and an atomic distance close to that of aluminum.

Further, the high melting point metal compounds TiN, VN, $W_2N$, VC, $W_2C$, and $Mo_2N$ should preferably be deposited on a film composed mainly of Ti having enhanced (002) orientation by itself or a film composed mainly of Ta or Nb having enhanced (111) orientation by itself so that a film of the high melting point metal compound may have enhanced (111) orientation and an interconnecting metal film to be subsequently deposited thereon have enhanced (111) orientation. One exemplary structure is an underlying metal film including a Ti film and a TiN film deposited thereon as used in the foregoing examples. Such a structure is effective not only for reducing contact resistance, but also as a barrier metal layer for preventing reaction with the interconnecting metal.

Among the above-mentioned high melting point metals and high melting point metal compounds, those metals or metal compounds which have the same crystal structure and have a very close atomic distance, for example, Ta and Nb may be used as a mixture at any desired mix ratio.

Although the foregoing examples use aluminum as the interconnecting metal, use may be made of aluminum alloys containing Si, Cu, Ti, Sc, Hf or the like. Also there may be used Cu, Au, Ag or alloys thereof which have lower resistivity than aluminum and thus offer a metal interconnection of lower resistance. Although deposition of aluminum has been made by the CVD process using DMAH as a reactant, any other method such as sputtering and evaporation may be used. For application to miniaturized semiconductor devices, the CVD process is preferred because of improved fill-up ability. Where sputtering is used, a sample on which aluminum is to be deposited is preferably heated to a surface temperature of 350° C. or higher such that aluminum atoms being deposited may be increased in mobility whereby a fine connection hole is effectively filled up with the interconnecting metal. It is noted that the degree of fill-up achieved with such an effective filling-up method is largely altered by the surface state of the underlying metal film. It is then necessary that the underlying metal film be subject to plasma etching on the surface and an interconnecting metal film be then deposited thereon without exposing the sample surface to the ambient air.

Although DMAH is used for deposition of an aluminum film by CVD in the foregoing examples, there may be used another source material, for example, triisobutylaluminum, trimethylaluminum, trimethylamine alane, dimethylethylamine alane and an intermolecular compound of DMAH and trimethylaluminum. Any of these source materials may be mixed with a gas containing Si, Ti, Cu or the like to deposit an aluminum alloy film. It is noted that an aluminum film of higher quality which has a minimized content of residual carbon resulting from the reactant gas is obtained when DMAH is used.

EXAMPLE 5

FIGS. 9(a) to 9(e) illustrate sequential steps of a further exemplary process of forming a metal interconnection structure according to the present invention. Each step is schematically illustrated by the cross-sectional view of a contact portion.

Figure 9A:
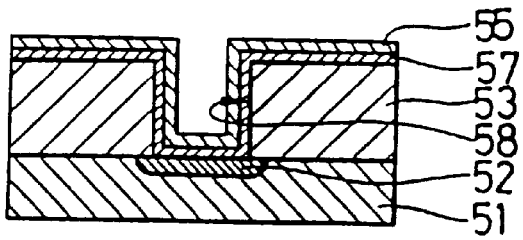
FIGS. 9(a) to 9(e) illustrate successive steps of a process of forming a metal interconnection according to a further embodiment of the present invention.

Initial steps of perforating a connection hole 58 in an insulating film 53 are the same as in the example shown in FIG. 3(a). An underlying metal film including a Ti film 57 and a TiN film 55 is formed thereon as shown in FIG. 9(a). In this drawing, numeral reference 51 denotes a silicon substrate, and number reference 52 denotes a highly doped diffusion region.

Figure 9B:
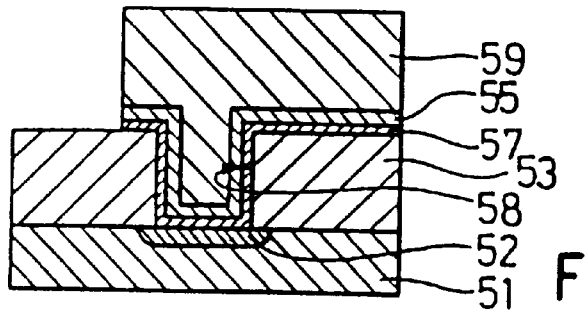

Next, a resist pattern 59 is formed where a metal interconnection structure 54 is to be formed. The underlying metal film outside the pattern is removed by dry etching using a gas atmosphere containing fluorine as shown in FIG. 9(b). At this point, the underlying metal film is defined where the metal interconnection structure 54 is to be formed.

Figure 9C:
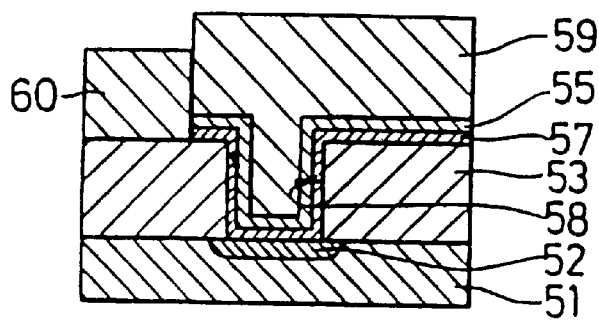

Next, an insulating film 60 of $SiO_2$ is deposited to a thickness of 0.8 $\mu$m, for example, by a liquid phase deposition (LPD) process as shown in FIG. 9(c). With respect to $SiO_2$ deposition by LPD, reference is made to H. Homma et al., '90 Symposium on VLSI Technology, pp. 3–4. Silicon dioxide is precipitated from a $H_2SiF_6$ solution containing saturated $SiO_2$, thereby depositing a $SiO_2$ film only where no resist pattern is present.

Figure 9D:
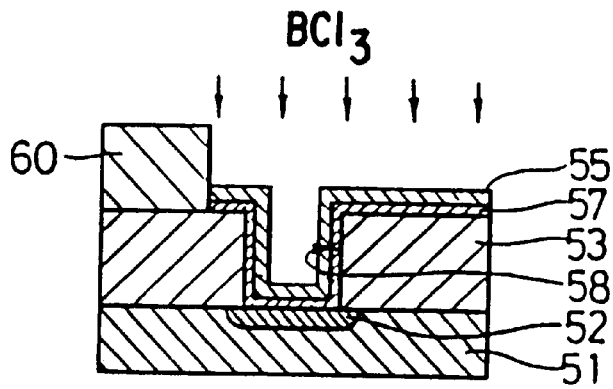
Figure 9E:
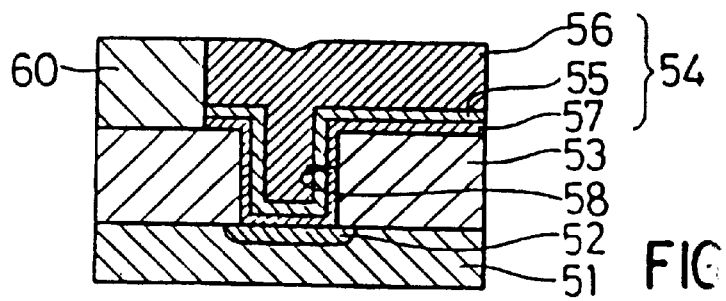

The resist is then removed. Using $BCl_3$ gas, plasma etching is carried out on the surface of the underlying metal film as shown in FIG. 9(d). Subsequently, an aluminum film 56 is deposited by a CVD process using DMAH as a source material. By carrying out aluminum deposition by a CVD process under the conditions previously set forth in the embodiment of FIG. 3, the Al film 56 is selectively deposited only on the underlying metal film. At this point, there is obtained the metal interconnection structure 54 including successively deposited Al film 56, TiN film 55 and Ti film 57 as shown in FIG. 9(e).

Since the underlying metal film on the surface is plasma etched using BC13 gas before the Al film is deposited by a CVD process in this example of the inventive method, the Al film can be deposited even in a fine connection hole with improved coverage or fill-up ability. The Al film on the insulating film 53 has enhanced (111) preferential orientation. Thus the resulting metal interconnection structure is highly reliable. As opposed to the method shown in FIG. 3, this embodiment allows a metal interconnection structure to be formed without utilizing a dry etching process of Al film requiring a high degree of skill.

EXAMPLE 6

FIGS. 10(a) to 10(g) illustrate sequential steps of a further exemplary process of forming a metal interconnection structure according to the present invention. Each step is schematically illustrated by the cross-sectional view of a contact portion.

Figure 10A:
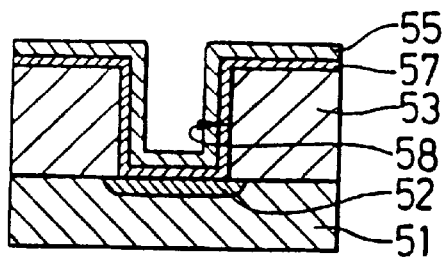
FIGS. 10(a) to 10(g) illustrate successive steps of a process of forming a metal interconnection according to a still further embodiment of the present invention.

Initial steps of perforating a connection hole 58 in the insulating film 53 are the same as in the example shown in FIG. 3. An underlying metal film including a Ti film 57 and a TiN film 55 is formed thereon as shown in FIG. 10(a).

Figure 10E:
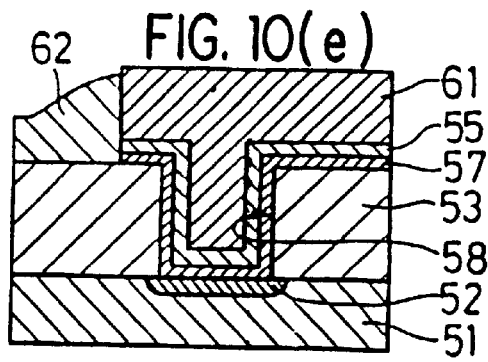
Figure 10B:
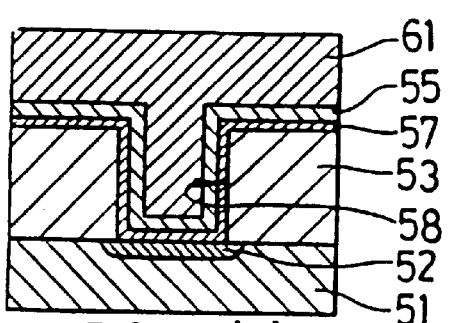
Figure 10F:
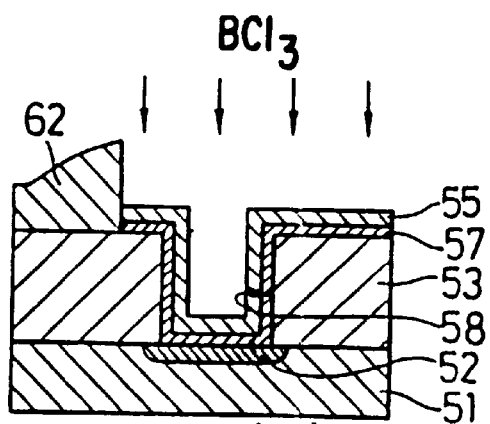
Figure 10C:
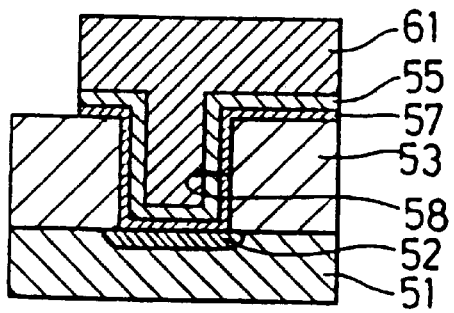

Next, an insulating film 61 of $SiO_2$ is formed over the entire surface of the structure by a plasma-assisted CVD process using tetraethylorthosilicate (TEOS) and oxygen as shown in FIG. 10(b). Using a conventional photolithography and dry etching technique, the $SiO_2$ film 61 and the underlying metal film are selectively removed to leave the $SiO_2$ film 61 and underlying metal film only where a metal interconnection structure is to be formed, as shown in FIG. 10(c).

Figure 10G:
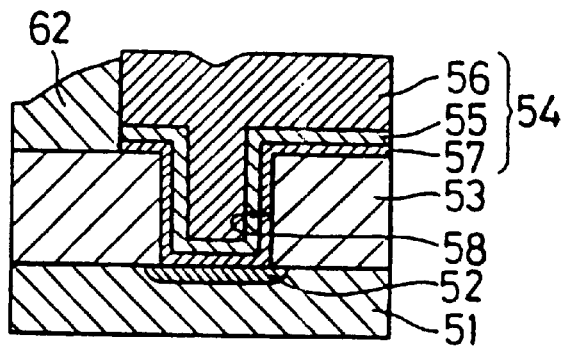
Figure 10D:
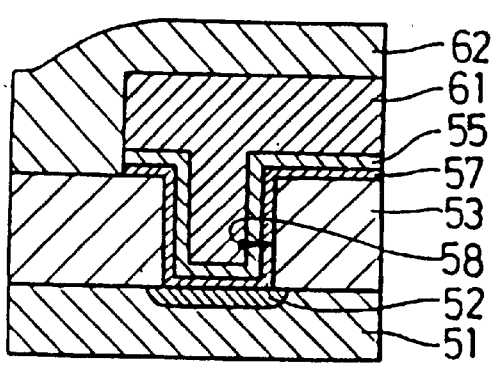

A solution containing a polyimide precursor is coated to the structure and polymerized by heating, forming an insulating film 62 of polyimide as shown in FIG. 10(d). The polyimide film 62 is then etched back by dry etching using oxygen gas until the surface of the $SiO_2$ film 61 is exposed as shown in FIG. 10(e). At this point, the polyimide film 62 is left where an upper interconnecting layer is not to be formed.

By dry etching using a fluorine-containing gas, the $SiO_2$ film 61 is removed to expose the underlying metal film. The surface of the underlying metal film is subject to plasma etching using $BCl_3$ gas as shown in FIG. 10(f). By a CVD process using DMAH as a reactant, an aluminum film 56 is selectively deposited only on the surface of the underlying metal film. At this point, there is obtained the metal interconnection structure 54 including successively deposited Al film 56, TiN film 55 and Ti film 57 as shown in FIG. 10(g).

This procedure uses a polyimide having a lower dielectric constant than $SiO_2$ as an insulating film between metal lines so that the capacitance between metal lines may be reduced. This is advantageous for the manufacture of LSIs requiring high speed operation. Organic insulating films other than polyimide may be similarly used as well as organic SOG.

EXAMPLE 7

Figure 11:
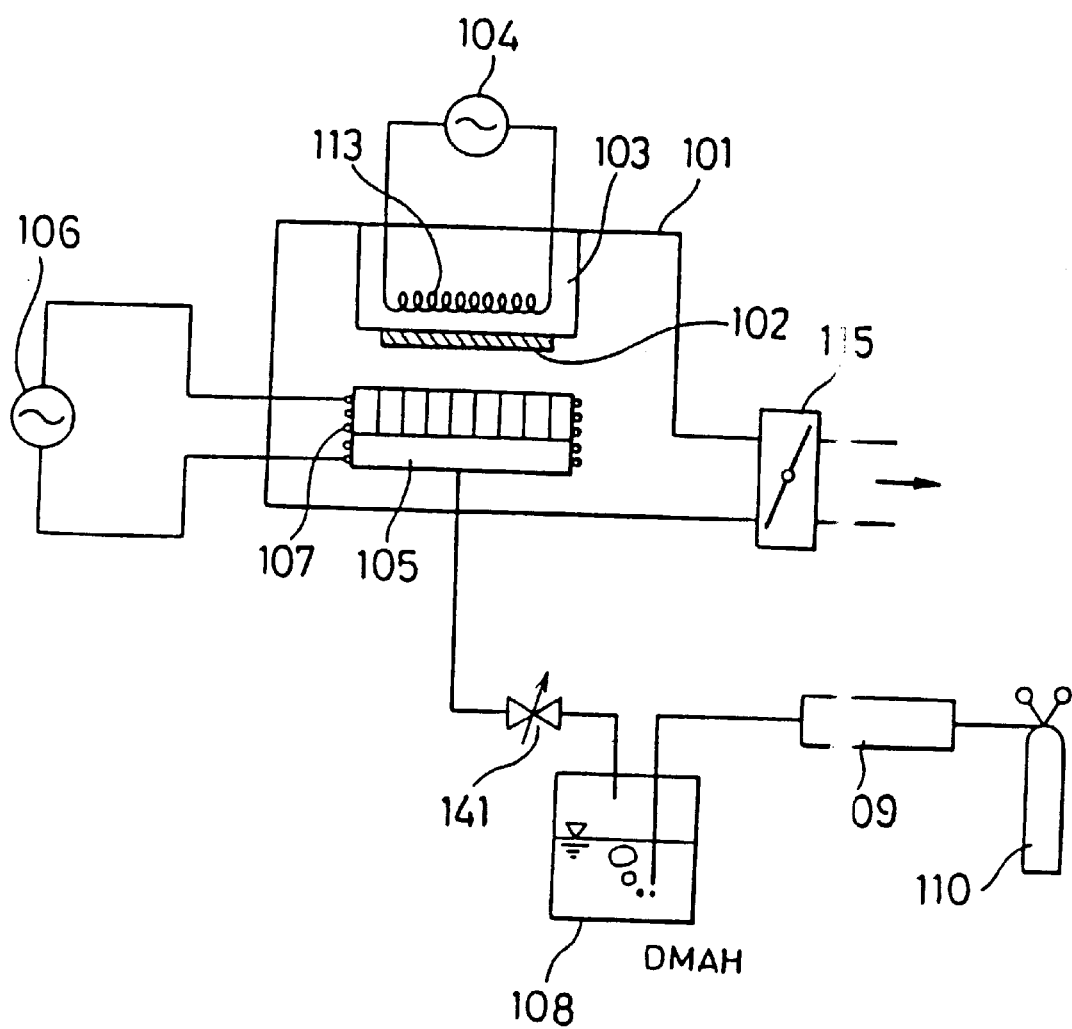
FIG. 11 schematically illustrates one exemplary CVD apparatus used in the present method.

FIG. 11 schematically illustrates an overall arrangement of a CVD apparatus used in this example. The apparatus includes a reactor vessel 101 for forming an aluminum interconnection through chemical vapor deposition and a bubbler 108 for generating a reactant gas mixture for feeding the reactor 101.

Disposed in the reactor vessel 101 is a support 103 supporting a substrate 102 on which a metal interconnection is to be formed. A gas nozzle 105 is opposed to the substrate susceptor 103 for injecting the reactant gas mixture into the reactor. The gas nozzle 105 is surrounded by a heater 107 which is electrically connected to a power supply 106 so that the amount of heat generated by the heater 107 may be adjusted by controlling the power supply 106. Also disposed in the substrate susceptor 103 is a heater 113 which is electrically connected to a power supply 104 so that the amount of heat generated by the heater 113 may be adjusted by controlling the power supply 104. The power supply 104 conducts electricity across the heater 113 to generate heat for heating the susceptor 103 and substrate 102 to a predetermined temperature. The reactor vessel 101 has an exhaust port near its bottom where a valve 115 is disposed for adjusting the internal pressure of the reactor vessel 101.

The bubbler 108 is disposed in a temperature-controlled oil bath (not shown) and charged with liquid DMAH in a sealed manner. A carrier gas is supplied from a source 110 to the bubbler 108 through a mass flow controller 109. More particularly, the carrier gas is bubbled into the DMAH in the bubbler 108 to generate a reactant gas mixture of aluminum reactant gas and carrier gas, which is then fed into the reactor 101 through the nozzle 105 for injecting toward the substrate 102. The pressure within the bubbler 108 is adjusted by means of a pressure regulator valve 141.

EXAMPLE 7-1

Figure 17:
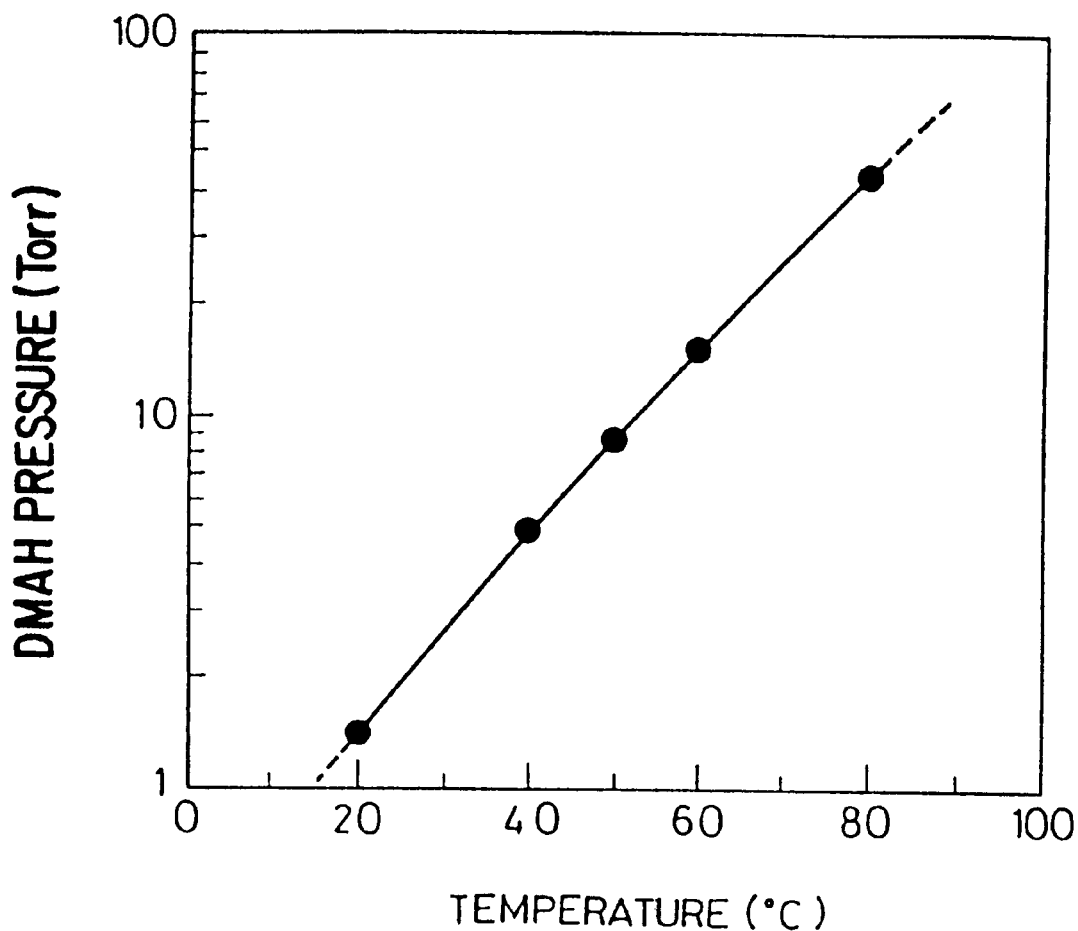
FIG. 17 is a graph showing the vapor pressure curve of DMAH.

The apparatus shown in FIG. 11 was used for CVD. In accordance with the procedure described in conjunction with FIG. 1(a), an insulating film was formed on a silicon substrate, an underlying metal film of Ti and TiN films was formed thereon, and an aluminum film was deposited on the substrate by a CVD process. In this example, surface treatment by plasma etching was omitted. The carrier gas was hydrogen gas and fed at a controlled flow rate of 100 SCCM through the mass flow controller 109. The pressure within the bubbler 108 was adjusted to 500 Torr. The DMAH charge was heated at 50° C. by the oil bath (not shown). Deposition conditions included a reactor pressure of 2 Torr and a substrate temperature of 260° C. (by heater 113). The reactant gas mixture had a DMAH concentration of about 1.7 mol %. The nozzle temperature heated by heater 107, that is, the heating temperature of reactant gas mixture was varied from 80° C. to 220° C. Note that under the given condition, DMAH has a vapor pressure of 8.5 Torr as seen from FIG. 17. The flow rate of DMAH fed with the carrier gas is calculated by (carrier gas flow rate)×(DMAH vapor pressure)/(bubbler internal pressure)=1.7 SCCM. Then the DMAH partial pressure in the reactor 101 is calculated by (reactor internal pressure)×(DMAH flow rate)/(carrier gas flow rate+DMAH flow rate)=33.4 mTorr. The molar concentration of DMAH in the reaction atmosphere is (DMAH partial pressure)/(reactor internal pressure)=1.7%. The Al film deposited had a thickness of about 1 μm.

Figure 12:
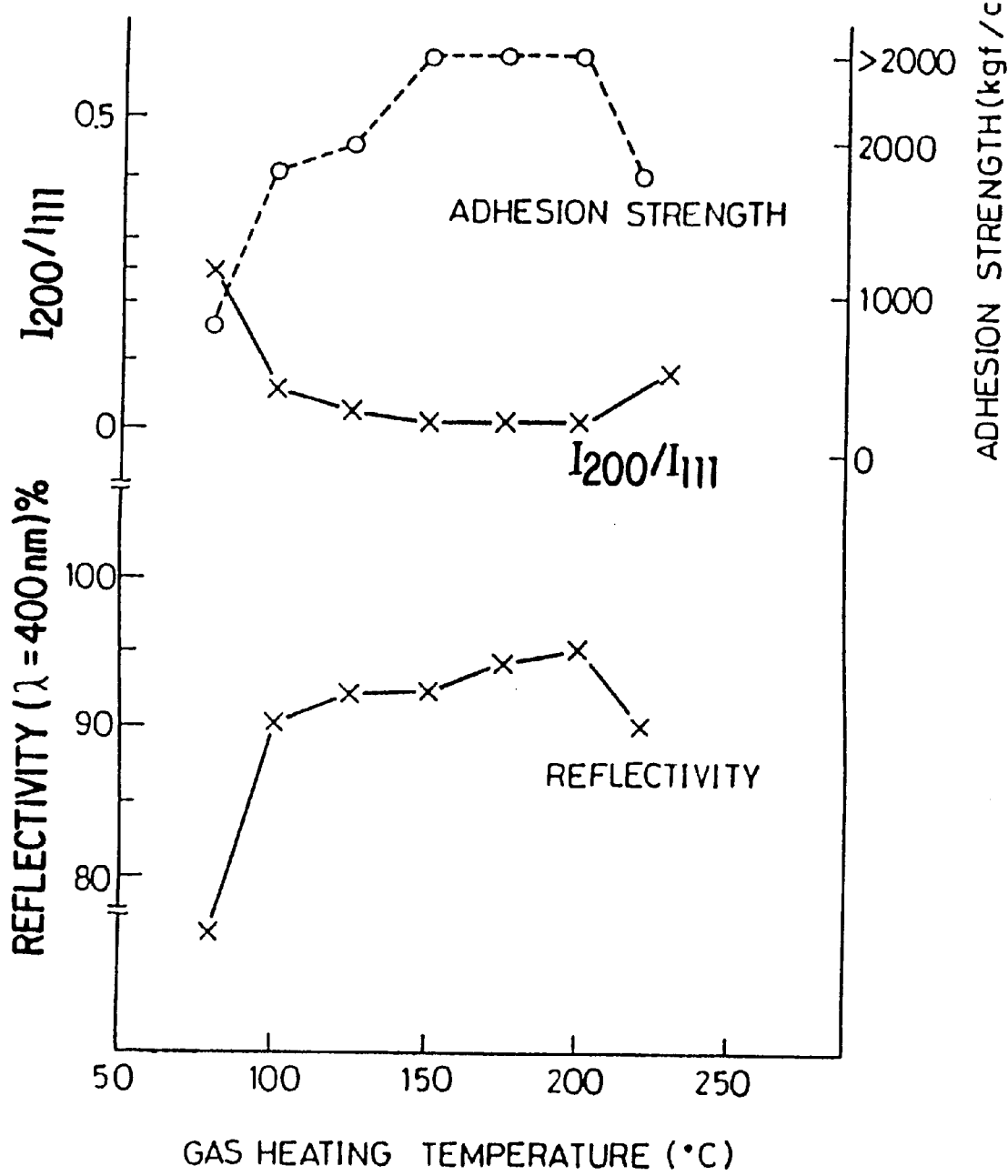
FIG. 12 is a graph showing the reflectivity, I(200)/I(111) and adhesive strength of Al films deposited by heating the reactant gas mixture at the indicated temperature.

The thus obtained Al films were measured for reflectivity at a wavelength λ=400 nm. FIG. 12 shows how the Al film changes reflectivity depending on the temperature of the reactant gas mixture. Heating temperatures of the reactant gas mixture in the range of 100 to 200° C. ensured formation of smooth aluminum films having metallic luster and a reflectivity of greater than 90%. The Al films were also evaluated for in-plane orientation by X-ray diffractometry. I(200)/I(111) is plotted relative to the gas heating temperature in FIG. 12. In the temperature range of 100 to 200° C., little diffraction peak was found other than (111). The films were evaluated for adhesion strength by an adhesion test. Adhesion strength is plotted relative to the gas heating temperature in FIG. 12. In the temperature range of 100 to 200° C., the adhesion strength was more than 2,000 kgf/cm², which is acceptable for practical use. For all these measurements, better results were obtained at gas heating temperatures in the range of 150 to 200° C.

EXAMPLE 7-2

Figure 13:
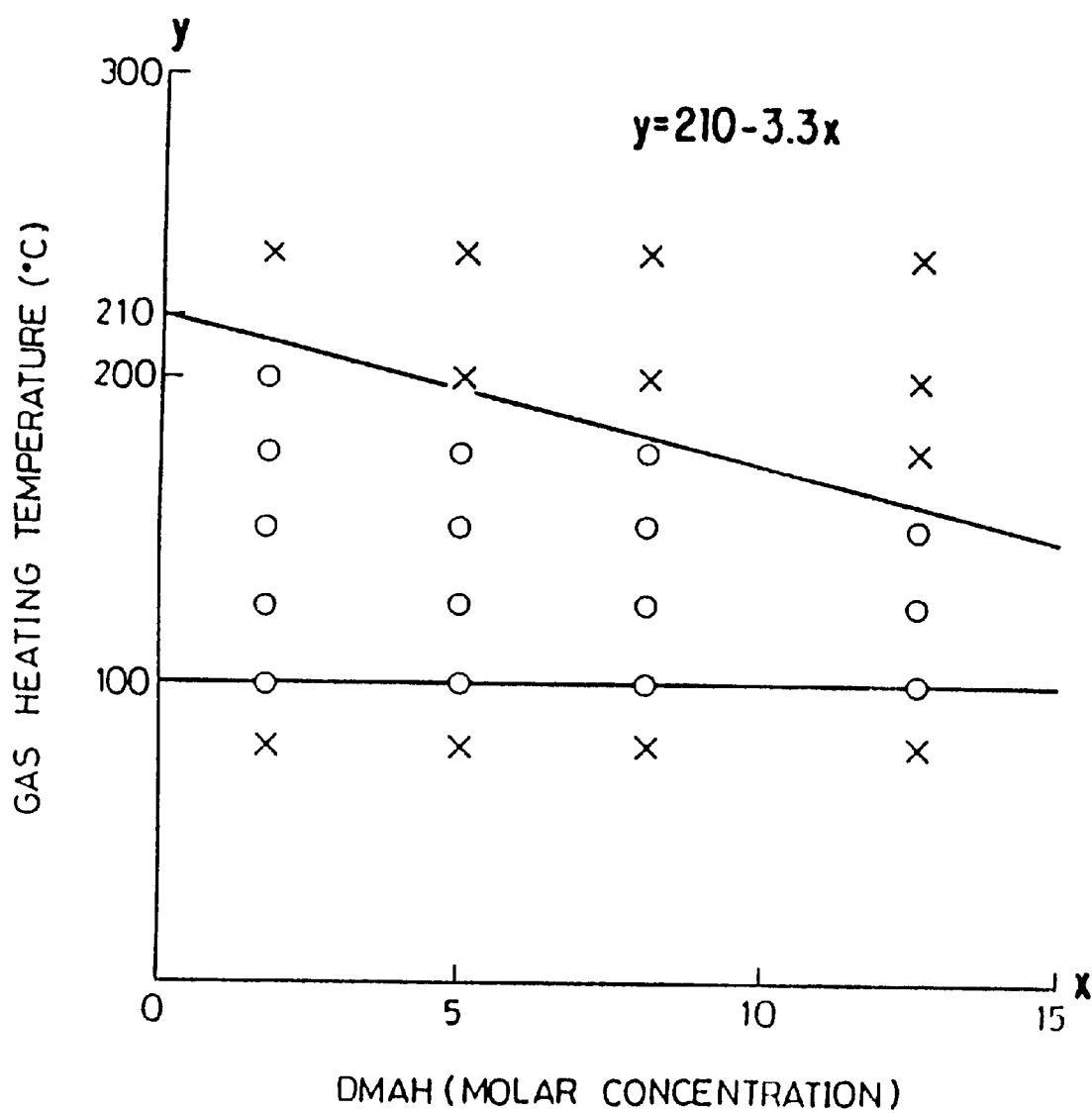
FIG. 13 is a graph showing the reflectivity of Al film deposited at different gas heating temperatures and different molar concentrations of DMAH in the reactant gas mixture.

Aluminum films were deposited under the same conditions as in Example 7-1 except that the bubbling pressure was varied to adjust the amount of evaporation to vary the molar concentration of DMAH in the reactant gas mixture while the heating temperature of reactant gas mixture was varied. The thus obtained Al films were measured for reflectivity at a wavelength λ=400 nm. In FIG. 13, the molar concentration of DMAH in reactant gas mixture is plotted on x axis and the heating temperature of reactant gas mixture is plotted on y axis. Those films having a reflectivity of more than 90% are acceptable (depicted by O) whereas those films having a reflectivity of less than 90% are rejected (depicted by X). As the DMAH concentration increases, the upper limit of reactant gas mixture heating temperature lowers. It is derived from the diagram of FIG. 13 that the upper limit of reactant gas mixture heating temperature, Tmax, is $$Tmax=210-3.3X$$

wherein X is a molar concentration of DMAH in reactant gas mixture (mol %). The lower limit of the reactant gas mixture heating temperature above which favorable evaluation is obtained was 100° C. Then the reactant gas mixture heating temperature T (°C.) is preferably in the following range.

$$100<T<210-3.3X$$

As in Example 7-1 (see FIG. 12), those films having a high reflectivity are films having an adhesive force of at least 2,000 kgf/cm$^2$ and (111) preferential orientation. Films with higher adhesive force and greater orientation were obtained at a higher reactant gas mixture heating temperature within the temperature range T defined by the above formula.

EXAMPLE 7-3

Figure 14A:
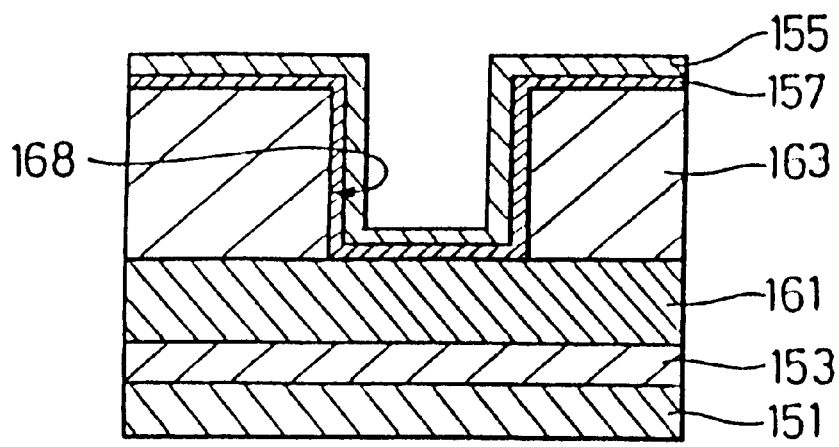
FIG. 14(a) is a cross section of a connection hole.
Figure 14B:
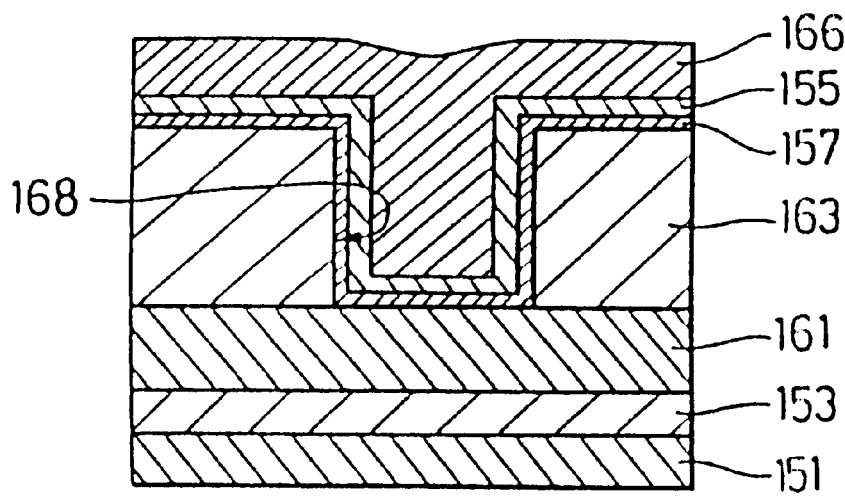
FIGS. 14(b) and 14(c) are cross sections of a connection hole which is filled up with aluminum under the respective condition.

As shown in FIG. 14(a), a insulating film 163 of 0.8 μm thick was formed on the interconnection 161, a via hole of 0.4 μm diameter was formed in the insulating film 163, and an underlying metal film of Ti film 157 and TiN film 155 was formed thereon. Under the same conditions as in Example 7-1, an aluminum film was deposited on the structure by a CVD process. An aluminum film ensuring full coverage in the via hole as shown in FIG. 14(b) was formed when the reactant gas mixture was at a temperature in the range of 100 to 200° C. In these drawings, numeral reference 151 denotes a silicon substrate, and numeral reference 153 denotes an insulating film.

COMPARATIVE EXAMPLE

Figure 14C:
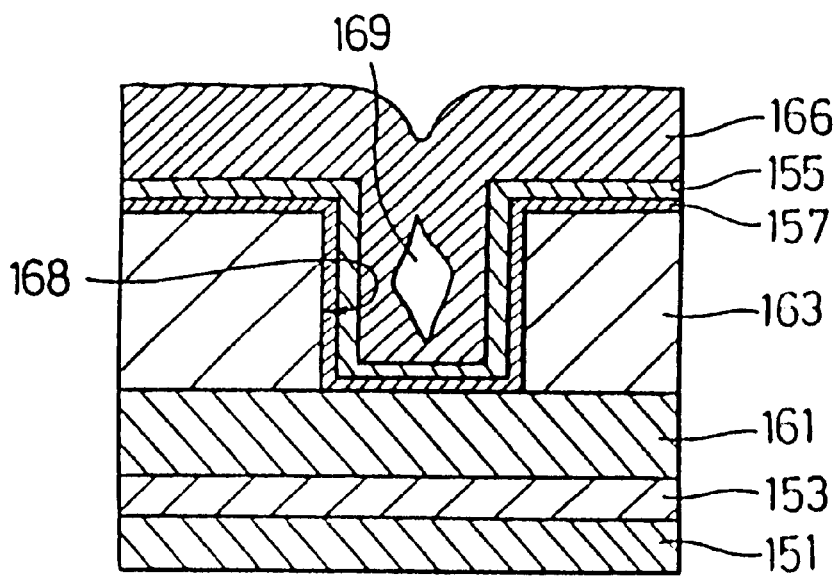

Aluminum was deposited under the same conditions as in Example 7-2 except that the reactant gas mixture was heated at a temperature of 80° C. A void 169 was found in the aluminum film within the via hole as shown in FIG. 14(c), indicating poor coverage. The aluminum film had a rugged surface.

It was found that an aluminum film having satisfactory orientation, smooth surface and improved coverage can be deposited on the underlying metal film by heating a reactant gas mixture at an appropriate temperature instead of plasma etching of the underlying metal film surface. This phenomenon is interpreted as follows.

DMAH used as a reactant is very likely to polymerize and present in an evaporated state with some molecules polymerized. Then DMAH molecules are in a partially polymerized state on arrival at the underlying metal film surface whereupon aluminum atoms are created through dissociation of partially polymerized DMAH molecules into monomers and subsequent formation of intermediates by thermal dissociation. The CVD process of partially polymerized DMAH is low in reactivity and largely affected by the presence of an altered or adsorbed layer on the underlying metal film surface.

If the reactant gas mixture is heated, partially polymerized DMAH molecules are dissociated into monomers. Monomeric DMAH molecules are thermally dissociated to form intermediates. Such monomers and intermediates have higher reactivity than the polymerized DMAH molecules and are not largely affected by the presence of an altered or adsorbed layer on the underlying metal film surface, ensuring deposition of an aluminum film having good orientation, smooth surface and fill-up ability. Of course, an aluminum film which is further improved in orientation, smooth surface and fill-up ability can be obtained when the underlying metal film is plasma etched on the surface prior to CVD and the reactant gas mixture is heated at an optimum temperature during CVD.

This Example is directed to a case wherein the aluminum film 166 was deposited on the substrate having deposited thereon the underlying metal film of Ti film 157 and TiN film 155. However, the process as carried out in this Example wherein the reactant gas mixture is heated to an appropriate temperature to increase its reactivity involves no change in the surface conditions of the surface on which the reactant is deposited. Therefore, such process may also be used in the case wherein no underlying metal film is deposited on the substrate. For example, such process may be used in such a case wherein an aluminum film is directly deposited on a substrate having deposited thereon an insulating film having connection holes formed therethrough, with no underlying metal film deposited on the insulating film.

EXAMPLE 7-4

Figure 15:
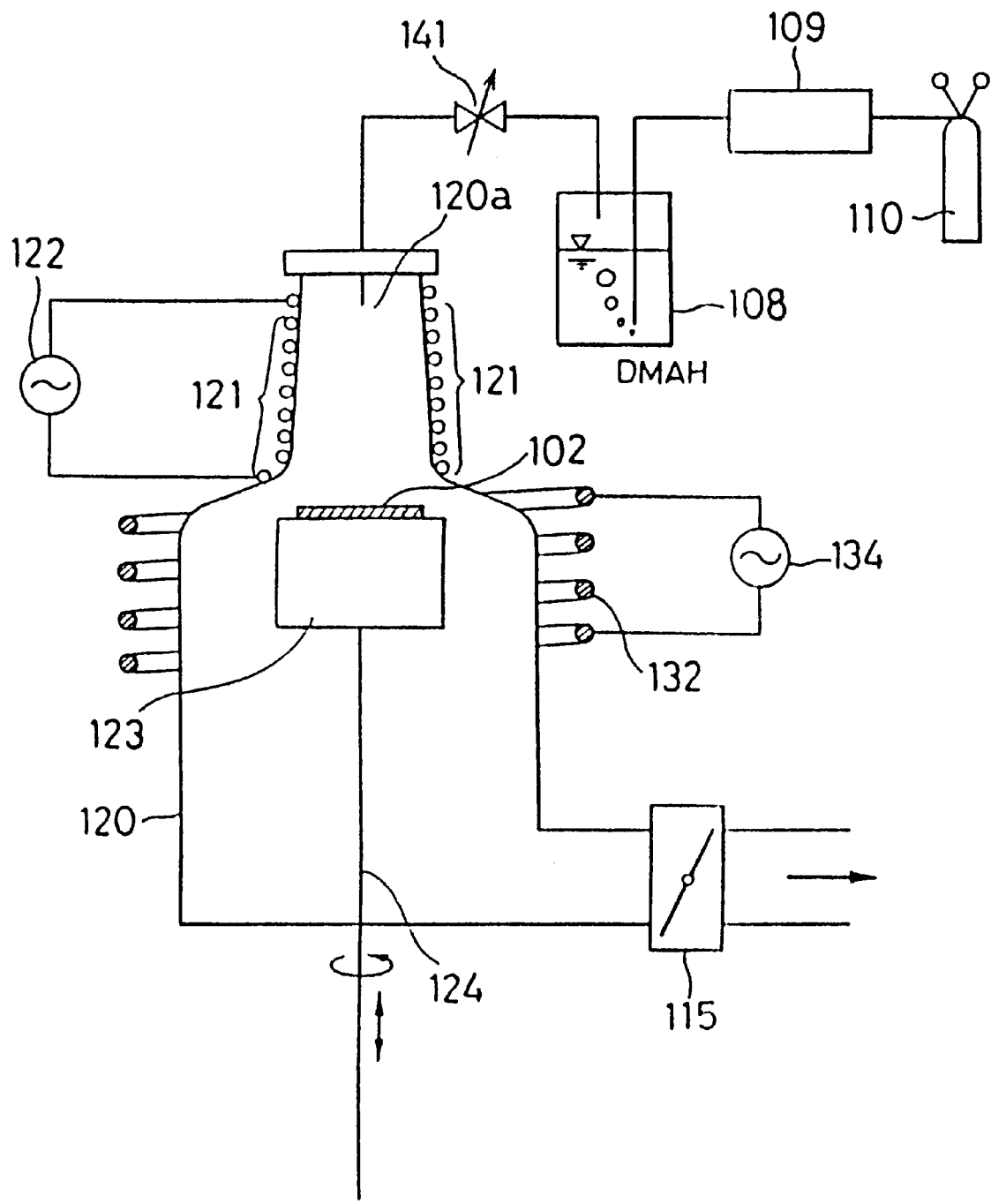
FIG. 15 schematically illustrates another exemplary CVD apparatus used in the present method.

While Examples 7-1 to 7-3 used the CVD apparatus of FIG. 11, this example used another CVD apparatus as shown in FIG. 15. The CVD apparatus includes a reactor vessel 120 having a body and a reduced diameter throat which forms a gas inlet 120a. A heater 121 is disposed around the inlet throat 120a for heating a reactant gas mixture being introduced through the inlet 120a. The amount of heat generated by the heater 121 is controlled by means of a power supply 122 connected across the heater 121.

Around the reactor vessel body is disposed an RF induction coil 132 which is electrically connected across an RF power supply 134. Then the RF induction coil 132 is actuated to heat a graphite susceptor 123 which is disposed within the reactor vessel body at an appropriate level. The graphite susceptor 123 is attached to the top of a shaft 124 so that the susceptor 123 is rotated together with the shaft 124 as shown by an arrow. A substrate 102 rests on the graphite susceptor 123. The remaining components are substantially the same as in FIG. 11. Like reference numerals are applied to like parts as in the previous embodiment and the description of these components is omitted herein.

The CVD apparatus of this construction permits a reactant gas mixture to be appropriately heated prior to its arrival at the substrate, with the results equivalent to those of the previous examples.

EXAMPLE 8

Figure 16:
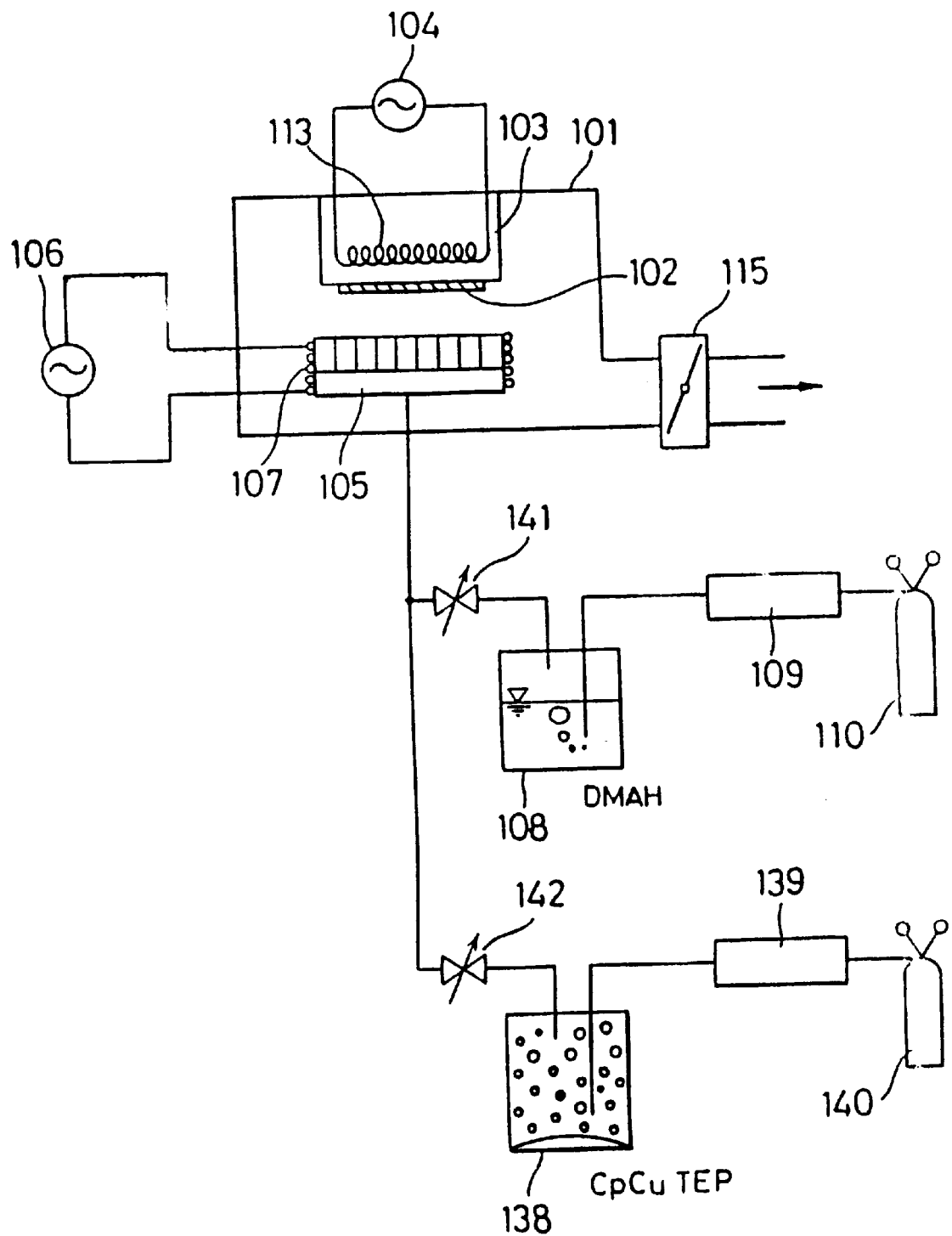
FIG. 16 schematically illustrates a further exemplary CVD apparatus used in the present method.

In an apparatus as shown in FIG. 16, AlCu alloy was deposited using reactants of dimethylaluminumhydride (DMAH) and cyclopentadienylcopper triethylphosphine (CpCuTEP). This apparatus is equal to the apparatus of FIG. 11 with a CpCuTEP gas feed system added. The additional feed system includes a bubbler 138, a mass flow controller 139, a carrier gas source 140, and a valve 142. The bubbler 138 is disposed in a temperature-controlled oil bath (not shown) and charged with powder CpCuTEP. A carrier gas is fed from the source 140 to the bubbler 138. The CpCuTEP-bearing carrier gas from the bubbler 138 is mixed with the DMAH-bearing carrier gas from the bubbler 108 and then introduced toward the substrate 102 through the nozzle 105.

EXAMPLE 8-1

The apparatus shown in FIG. 16 was used for CVD. In accordance with the procedure described in conjunction with FIG. 1(a), an insulating film was formed on a silicon substrate, an underlying metal film of Ti and TiN films was formed thereon, and an aluminum film was deposited on the substrate by a CVD process. In this example, surface treatment by plasma etching was omitted.

Figure 18:
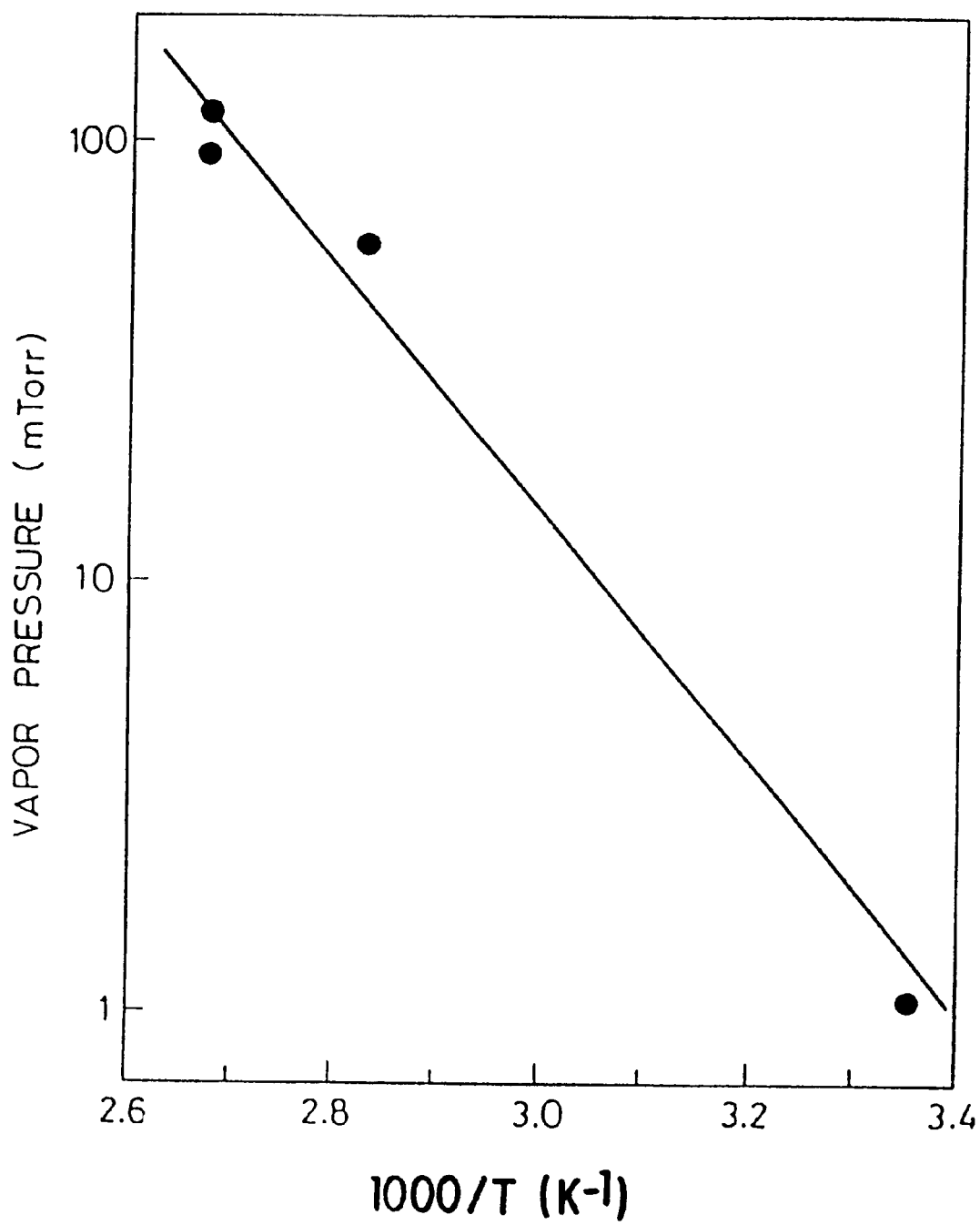
FIG. 18 is a graph showing the vapor pressure curve of CpCuTEP.

The carrier gas was hydrogen gas for both of the sources 110 and 140 and fed at a controlled flow rate of 100 SCCM through the mass flow controllers 109 and 139. The bubblers 108 and 138 were adjusted to a temperature of 50° C. and 100° C. and a pressure of 500 Torr and 170 Torr, respectively. The reactor 101 had an internal pressure of 2 Torr, the substrate 102 was heated to a temperature of 250° C. by heater 113, and the nozzle and hence, reactant gas mixture was heated to a temperature of 80° C. by heater 107, which is a temperature having no substantial influence on coverage as is evident from Comparative Example of Example 7. The flow rate of DMAH fed with the carrier gas was 1.7 SCCM as in Example 7-1. Since CpCuTEP has a vapor pressure of about 100 mTorr under the given condition as seen from FIG. 18, the flow rate of CpCuTEP is calculated by (carrier gas flow rate)×(CpCuTEP vapor pressure)/(bubbler internal pressure)=0.059 SCCM. Then the DMAH partial pressure in the reactor 101 is calculated by (reactor internal pressure)× (DMAH flow rate)/(DMAH carrier gas flow rate+DMAH flow rate+CpCuTEP carrier gas flow rate+CpCuTEP flow rate)=16.9 mTorr. The CpCuTEP partial pressure in the reactor 101 is calculated by (reactor internal pressure)× (CpCuTEP flow rate)/(DMAH carrier gas flow rate+DMAH flow rate+CpCuTEP carrier gas flow rate+CpCuTEP flow rate)=0.58 mTorr. Then the partial pressure ratio defined by the following formula using CpCuTEP partial pressure ($P_{CpCuTEP}$) and DMAH partial pressure ($P_{DMAH}$) as (CpCuTEP partial pressure)/(CpCuTEP partial pressure+ DMAH partial pressure), that is, $P_{CpCuTEP}/(P_{CpCuTEP}+P_{DMAH})$ is calculated to be 0.033.

The thus obtained Al film deposited contained 1.7 wt % or 0.7 at % of Cu. The concentration of C, O and P in the film was below the detection limit by Auger electron spectroscopy (AES).

EXAMPLE 8-2

Aluminum films were deposited while the ratio defined by the above formula using the CpCuTEP and DMAH partial pressures was varied from 0 to 0.3 by changing the bubbling conditions. The films were measured for Cu concentration. Using a conventional photolithography and dry etching technique, lines of 4 μm wide were defined in the aluminum film conductor to carry out an electromigration (EM) test. Table 2 shows the partial pressure ratio defined by the above formula, Cu concentration, and EM life.

TABLE 2

| $P_{CpCuTEP}/(P_{DMAH} + P_{CpCuTEP})$ | Cu concentration (wt %) | EM life (relative value) |
| --- | --- | --- |
| 0 | 0 | 0.05 |
| 0.001 | 0.06 | 0.1 |
| 0.003 | 0.2 | 0.2 |
| 0.01 | 0.6 | 0.5 |
| 0.033 | 1.7 | 1 |
| 0.1 | 5.4 | 2 |
| 0.2 | 9.6 | 1.6 |

As seen from Table 2, aluminum films having a Cu content (wt %) which is approximately one-half of the partial pressure ratio defined by the above formula insofar as the partial pressure ratio is in the range of from 0.001 to 0.2. Also in this range, the electromigration life is at least 2 times that of lines defined in a Cu-free aluminum film conductor.

EXAMPLE 8-3

On the same substrate as shown in FIG. 14(a), deposition was made under the same conditions as in Example 8-1. A film with good coverage as shown in FIG. 14(b) was formed.

It is thus evident that by carrying out CVD in an atmosphere containing DMAH and CpCuTEP mixed in an appropriate partial pressure ratio defined by the above formula, an aluminum film containing copper in a sufficient concentration to improve electromigration resistance is deposited with good coverage. The phenomenon that coverage is improved is understood as follows. Since CpCuTEP has a lower decomposition temperature than DMAH, CpCuTEP first decomposes on the underlying metal film surface to form an extremely thin film of copper. On this copper film, DMAH decomposes uniformly to form a film of aluminum. Therefore, an aluminum alloy film containing copper is deposited with good coverage even though plasma etching is omitted.

This Example is directed to a case wherein an aluminum film was deposited on the substrate having deposited thereon an underlying metal film of Ti and TiN films. However, the process as carried out in this Example wherein CpCuTEP is included in the reactant gas mixture to form a thin film of Cu on the underlying metal film involves no change in the conditions of the surface on which the reactants are deposited. Therefore, such process may also be used in the case wherein no underlying metal film is deposited on the substrate. For example, such process may be used in such a case wherein an aluminum film is directly deposited on a substrate having deposited thereon an insulating film having connection holes formed therethrough, with no intervening underlying metal film deposited on the insulating film.

Although DMAH is used for deposition of an aluminum film by CVD in the foregoing examples, there may be used another source material, for example, triisobutylaluminum, trimethylaluminum, trimethylamine alane, dimethylethylamine alane and an intermolecular compound of DMAH and trimethylaluminum. It is noted that an aluminum film of higher quality which has a minimized content of residual carbon resulting from the reactant gas is obtained when DMAH is used.

Although cyclopentadienylcopper triethylphosphine (CpCuTEP) is used as the organic copper compound, there may be used another source material, for example, an organic compound having a group wherein the cyclopentadiene ring is substituted with an alkyl group, a halide, or a pseudohalide (such as —CNO, —CNS, or —CN), instead of the cyclopentadienyl group. There may also be used another source material, for example, an organic copper compound having such tertiary alkylphosphine as trimethylphosphine or tripropylphosphine instead of the triethylphosphine; and an organic copper compound having such an electron donative ligand as tertiary alkylarsine. It should be noted that an organic copper compound containing oxygen is unfavorable since the aluminum alloy film deposited would contain oxygen to result in an increased resistance. Use of an organic copper compound having cyclopentadienyl group is preferred in view of the stability, and use of the cyclopentadienylcopper triethylphosphine (CpCuTEP) is most preferable in view of its relatively high vapor pressure enabling deposition of an aluminum alloy containing copper at a high concentration.

Any of these source materials may be mixed with a gas containing Si, Ti, or the like to deposit an aluminum alloy film containing such an element in addition to the copper.

According to one aspect of the present invention, by effecting plasma etching in an chlorine series gas atmosphere on the surface of an underlying metal film containing a high melting point metal or high melting point metal compound on a semiconductor substrate, any altered or adsorbed layer can be removed from the underlying metal film surface prior to formation of an interconnecting metal film composed mainly of Al, Cu, Au or Ag. The treated surface of the underlying metal film allows an interconnecting metal film to be deposited with proper orientation, for example, (111) preferential orientation for aluminum film. Additionally, in a single level or multilevel interconnection structure, fine connection holes such as contact holes and via holes are effectively filled up. In the metal interconnection structure having such improved properties, the underlying metal film and interconnecting metal film can be formed by a CVD, sputtering or other similar process. More effective fill-up or coverage of a connection hole is expected when either one or both of the underlying metal film and interconnecting metal film are formed by a CVD process.

According to the other aspect of the present invention, a connection hole between a semiconductor substrate or a lower layer interconnection and an upper layer interconnection is filled up with the upper layer of metallization while controlling the preferential crystal orientation of the interconnecting metal film of the upper layer. The connection hole is filled up with the underlying metal film or interconnecting metal film of quality to present a flat surface. The interconnecting metal film of the upper layer is deposited in a controlled manner to increase long-term reliability, achieving a highly reliable interconnection.

According to the further aspect of the present invention, the heating temperature of a DMAH reactant gas mixture is properly controlled in accordance with the molar concentration of DMAH in the mixture. This pre-heating of the reactant gas mixture allows reaction of DMAH intermediates to proceed appropriately. There results an aluminum interconnect film having a smooth surface and suitable for a lithographic process.

The aluminum interconnect film has increased adhesion to the underlying substrate, good step coverage, and (111) orientation. Such a highly reliable aluminum film can be formed by a CVD process in high yields.

We claim:

1. A metal interconnection structures, comprising:
   an insulating film formed over a semiconductor substrate;
   at least one connection hole in the insulating film;
   an underlying metal film including a first layer composed mainly of a refractory metal which has a cubic or hexagonal crystal structure formed on the insulating film and on a side wall of the connection hole and a second layer composed mainly of a refractory metal compound which has a cubic crystal structure formed on the first layer; and
   an interconnecting metal film containing predominantly a component selected from the group consisting of Al, Cu, Au and Ag on the underlying metal film, wherein said first layer of said underlying metal film on the insulating film has a (111) preferential orientation when said refractory metal has the cubic crystal structure or a (002) preferential orientation when said refractory metal has the hexagonal crystal structure;
   said second layer and said interconnecting metal film over the insulating film each has a (111) preferential orientation;
   said connection hole has an aspect ratio of at least 1; and
   a thickness of said second layer over the side wall of the connection hole is at least 0.5 times of a thickness of said second layer over the insulating film, or said connection hole is filled up with the underlying metal film.

2. The metal interconnection structure of claim 1, wherein said connection hole is filled up with the underlying metal film and the interconnecting metal film.

3. The metal interconnection structure of claim 1, wherein said connection hole is filled up with the underlying metal film.

4. The metal interconnection structure of claim 1, wherein the refractory metal of said first layer of said underlying metal film has a first atomic distance in a (111) plane when the metal has the cubic crystal structure or a (002) plane when the metal has the hexagonal crystal structure,
   the refractory metal compound of said second layer has a second atomic distance in a (111) plane,
   the component of said interconnecting metal film has a third atomic distance in a (111) plane,
   the ratio of the second atomic distance to the first atomic distance is from about 0.95 to about 1.05, and
   the ratio of the third atomic distance to the second atomic distance is from about 0.95 to about 1.05.

5. The metal interconnection structure of claim 1, wherein said refractory metal is selected from the group consisting of Ti, Ta, and Nb, said refractory metal compound is selected from the group consisting of TiN, VN, $W_2N$, VC, $W_2C$, and $Mo_2N$, and said component of the interconnecting metal film is Al or Au.

6. The metal interconnection structure of claim 1, wherein said refractory metal is Ti, said refractory metal compound is TiN, and the component of the interconnecting metal film is Al.

7. The metal interconnection structure of claim 1, wherein said refractory metal compound of the second layer is a refractory metal nitride.

8. The metal interconnection structure of claim 1, wherein said refractory metal compound of the second layer is titanium nitride.

9. The metal interconnection structure of claim 1, wherein said second layer has an I(111)/I(200) peak intensity ratio of Cu $K_\alpha$ X-ray diffraction of greater than about one.

10. The metal interconnection structure of claim 1, wherein said second layer has an I(111)/I(200) peak intensity ratio of Cu $K_\alpha$ X-ray diffraction of not less than about 4.

11. The metal interconnection structure of claim 1, wherein said second layer has an I(111)/I(200) peak intensity ratio of Cu $K_\alpha$ X-ray diffraction of not less than about 10.

12. The metal interconnection structure of claim 1, wherein said interconnecting metal film contains predominantly Al.

13. The metal interconnection structure of claim 1, wherein said interconnecting metal film has an I(111)/I(200) peak intensity ratio of Cu $K_\alpha$ X-ray diffraction of not less than about 20.

14. The metal interconnection structure of claim 1, wherein said interconnecting metal film has an I(111)/I(200) peak intensity ratio of Cu $K_\alpha$ X-ray diffraction of not less than about 2000.

15. The metal interconnection structure of claim 1, wherein the thickness of the second layer over the side wall of the connection hole is about the same as the thickness of the second layer over the surface of the insulating film.

16. The metal interconnection structure of claim 1, wherein said second layer of the underlying metal film prevents diffusion of the component of the interconnecting metal film.

17. A metal interconnection structure, comprising:

an insulating film formed over a semiconductor substrate;

at least one connection hole in the insulating film;

an underlying metal film including a layer composed mainly of a refractory metal compound which has a cubic crystal structure formed on the insulating film and on a side wall of the connection hole; and an interconnecting metal film containing predominantly a component selected from the group consisting of Al, Cu, Au and Ag on the underlying metal film, wherein said layer of the underlying metal film on the insulating film and said interconnecting metal film over the insulating film each has a (111) preferential orientation;

said connection hole has an aspect ratio of at least one; and a thickness of the layer of the underlying metal film on the side wall of the connection hole is at least 0.5 times of a thickness of the layer on the insulating film, or said connection hole is filled up with the underlying metal film.

18. The metal interconnection structure of claim 17, wherein said underlying metal film further includes a first layer composed mainly of a refractory metal which has a cubic or hexagonal crystal structure formed under the layer; and said first layer of the underlying metal film on the insulating film has a (111) preferential orientation when said refractory metal has the cubic crystal structure or a (002) preferential orientation when the refractory metal has the hexagonal crystal structure.

19. A metal interconnection structure, comprising:

an insulating film formed over a semiconductor substrate;

at least one connection hole in the insulating film; and an underlying metal film including a first layer composed mainly of a refractory metal which has a cubic or hexagonal crystal structure formed on the insulating film and on a side wall of the connection hole and a second layer composed mainly of a refractory metal compound which has a cubic crystal structure formed on the first layer, wherein said first layer of the underlying metal film has a (111) preferential orientation when said refractory metal has the cubic crystal structure or a (002) preferential orientation when the refractory metal has the hexagonal crystal structure;

said second layer of the underlying metal film over the insulating film has a (111) preferential orientation;

said connection hole has an aspect ratio of at least one; and a thickness of said second layer over the side wall of the connection hole is at least 0.5 times of a thickness of the second layer over the insulating film, or said connection hole is filled up with the underlying metal film.

20. The metal interconnection structure of claim 19, further comprising an interconnecting metal film containing predominantly a component selected from the group consisting of Al, Cu, Au and Ag on the underlying metal film, wherein said interconnecting metal film over the insulating film has a (111) preferential orientation.

* * * * *